(12) United States Patent
Uesaka et al.

(10) Patent No.: US 9,444,221 B2
(45) Date of Patent: Sep. 13, 2016

(54) LASER APPARATUS AND METHOD TO RE-TUNE EMISSION WAVELENGTH TUNABLE LD

(71) Applicants: Sumitomo Electric Industries, Ltd., Osaka-shi (JP); National Institute of Advanced Industrial Science and Technology, Tokyo (JP)

(72) Inventors: Katsumi Uesaka, Yokohama (JP); Eiichi Banno, Yokohama (JP); Hajime Shoji, Yokohama (JP); Hiroyuki Matsuura, Tsukuba (JP); Haruhiko Kuwatsuka, Tsukuba (JP); Ken Tanizawa, Tsukuba (JP); Shu Namiki, Tsukuba (JP)

(73) Assignees: Sumitomo Electric Industries, Ltd., Osaka-shi (JP); National Institute of Advanced Industrial Science and Technology, Tokyo (JP)

(*) Notice: Subject to any disclaimer, the term of this patent is extended or adjusted under 35 U.S.C. 154(b) by 0 days.

(21) Appl. No.: 14/790,667

(22) Filed: Jul. 2, 2015

(65) Prior Publication Data

US 2016/0006212 A1 Jan. 7, 2016

(30) Foreign Application Priority Data

Jul. 3, 2014 (JP) ................................ 2014-138000

(51) Int. Cl.
*H01S 3/10* (2006.01)
*H01S 5/0687* (2006.01)
(Continued)

(52) U.S. Cl.
CPC ........... *H01S 5/0687* (2013.01); *H01S 5/0607* (2013.01); *H01S 5/0612* (2013.01); *H01S 5/06256* (2013.01); *H01S 5/06837* (2013.01); *H01S 5/12* (2013.01); *H01S 5/125* (2013.01); *H01S 5/0265* (2013.01);
(Continued)

(58) Field of Classification Search
CPC ............. H01S 5/0687; H01S 5/06256; H01S 5/06258; H01S 5/0612; H01S 5/02415; H01S 5/1212; H01S 5/1209; H01S 5/0607; H01S 5/06837; H01S 5/125; H01S 5/12
USPC .......................................................... 372/20
See application file for complete search history.

(56) References Cited

U.S. PATENT DOCUMENTS

| | | | | |
|---|---|---|---|---|
| 2006/0222033 A1* | 10/2006 | Hayakawa | ........... | H01S 5/06256 372/50.11 |
| 2009/0200472 A1* | 8/2009 | Gregory | .................... | G01J 3/10 250/339.07 |
| 2013/0003762 A1* | 1/2013 | Kaneko | ............... | H01S 5/06256 372/20 |

FOREIGN PATENT DOCUMENTS

| | | |
|---|---|---|
| JP | 49-38872 B1 | 10/1974 |
| JP | 2008-085103 A | 4/2008 |
| JP | 4330063 B2 | 9/2009 |
| JP | 2013-033892 A | 2/2013 |

* cited by examiner

*Primary Examiner* — Kinam Park
(74) *Attorney, Agent, or Firm* — Venable LLP; Michael A. Sartori

(57) ABSTRACT

A laser apparatus for tuning the emission wavelength of a wavelength tunable laser diode will be described. The apparatus includes a tunable LD with heaters to tune the emission wavelength of the tunable LD, and a controller to control the power supplied to the heaters. A feature of the laser apparatus is that the controller supplies pre-emphasis power to the heaters before the supplement of the power corresponding to the re-tuned emission wavelength to accelerate the stability of the temperature of the heaters.

16 Claims, 21 Drawing Sheets

(51) Int. Cl.
*H01S 5/06* (2006.01)
*H01S 5/0683* (2006.01)
*H01S 5/125* (2006.01)
*H01S 5/12* (2006.01)
*H01S 5/0625* (2006.01)
*H01S 5/024* (2006.01)
*H01S 5/026* (2006.01)

(52) U.S. Cl.
CPC ....... *H01S 5/02415* (2013.01); *H01S 5/06258* (2013.01); *H01S 5/1209* (2013.01); *H01S 5/1212* (2013.01)

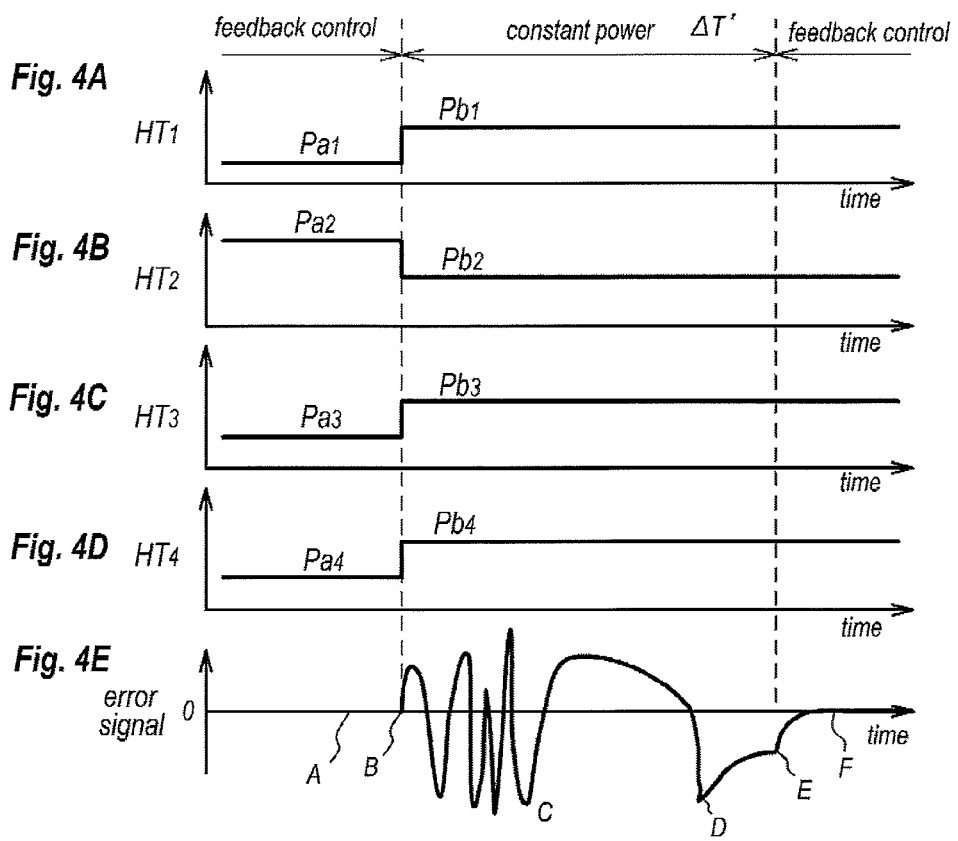
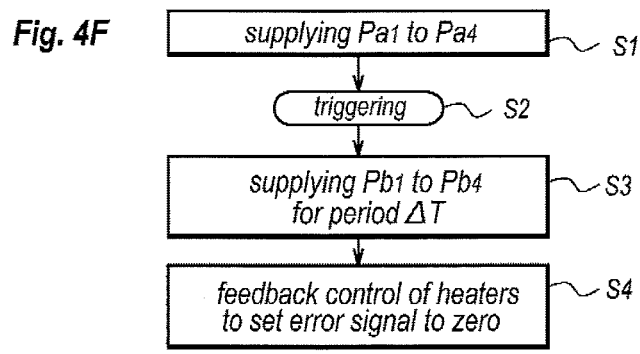

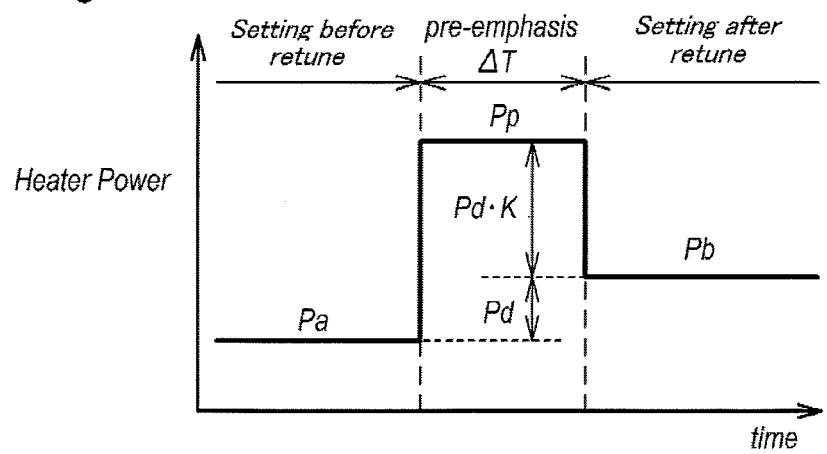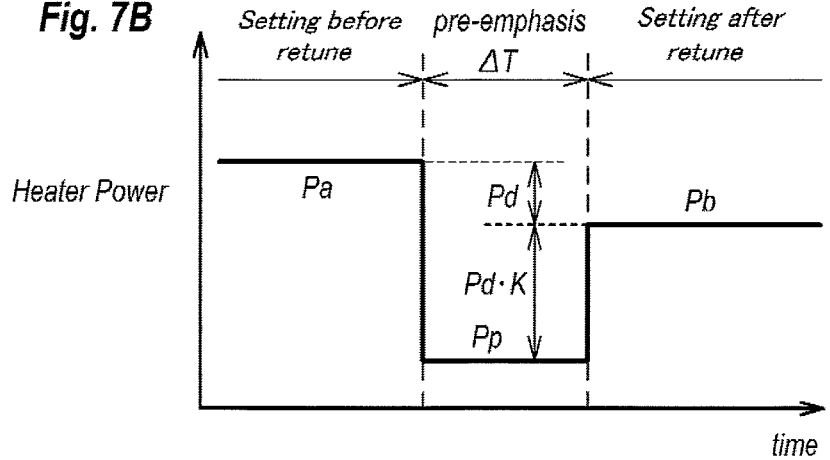

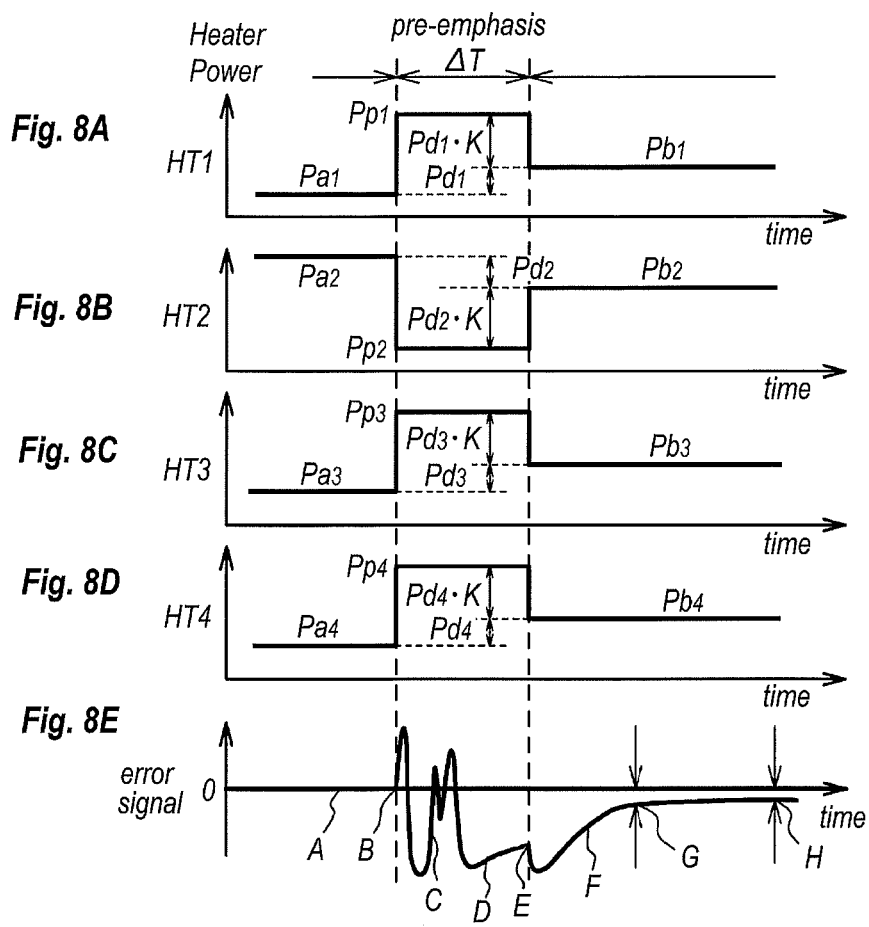
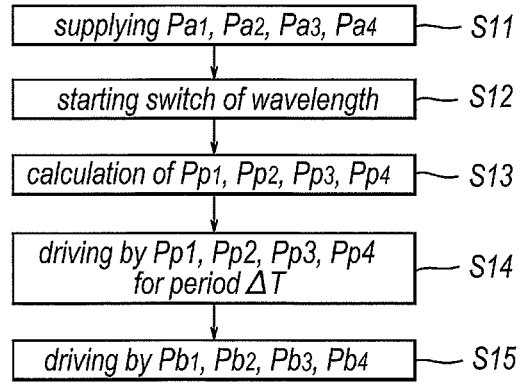

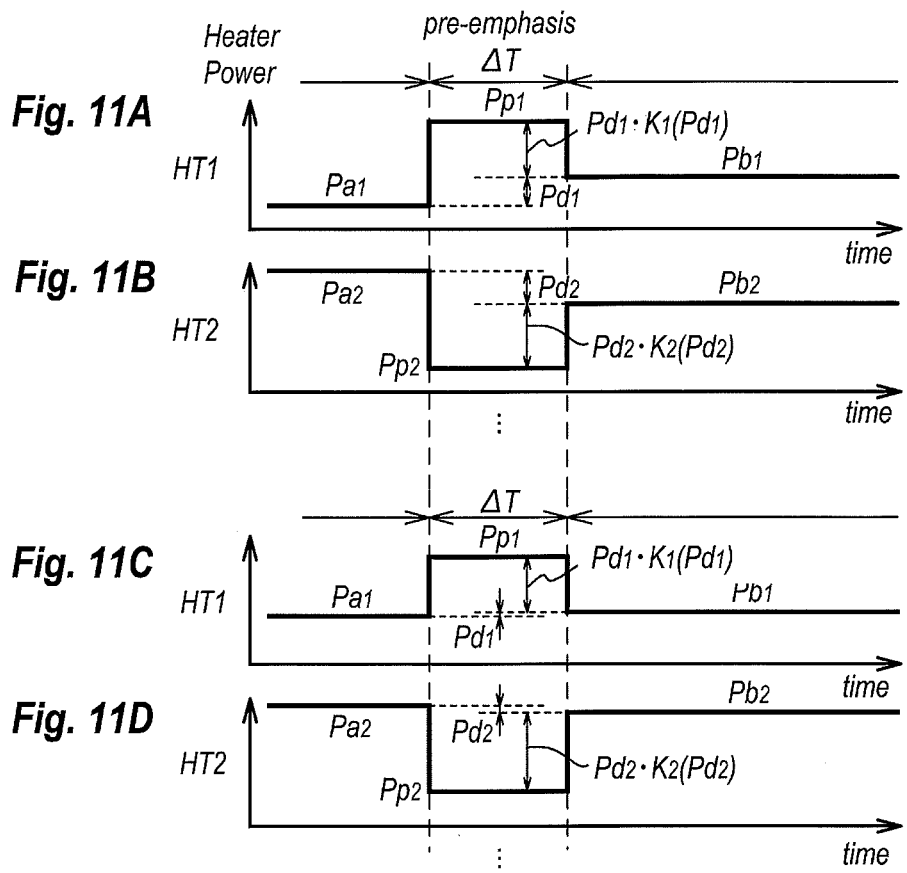
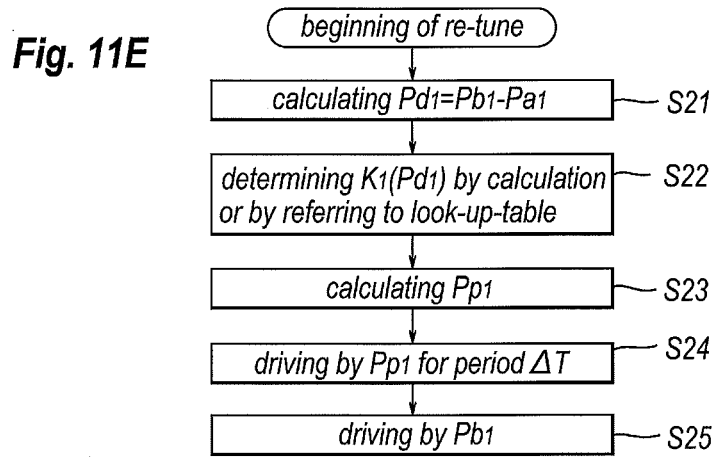

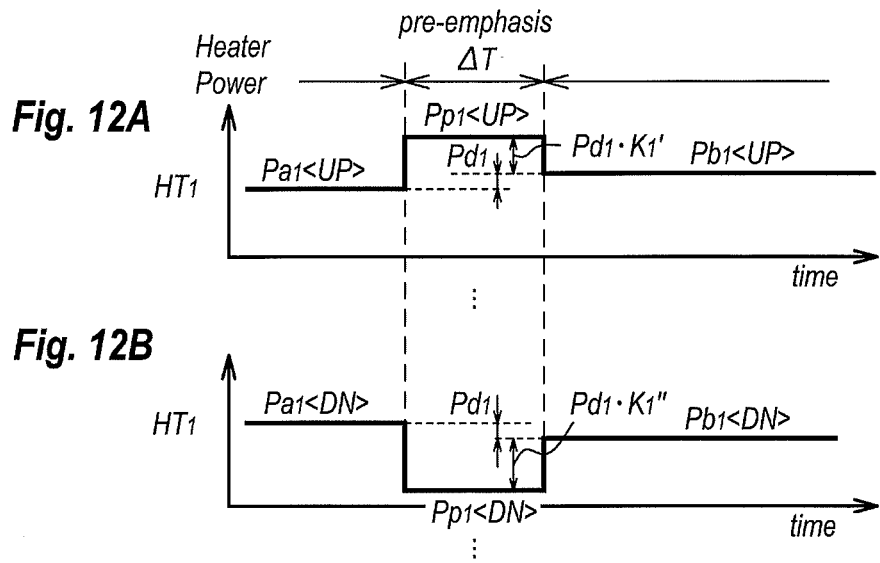
Fig. 12A
Fig. 12B
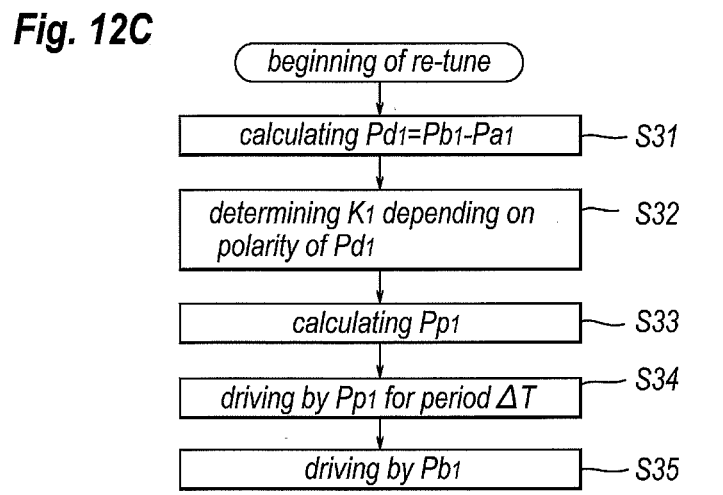
Fig. 12C

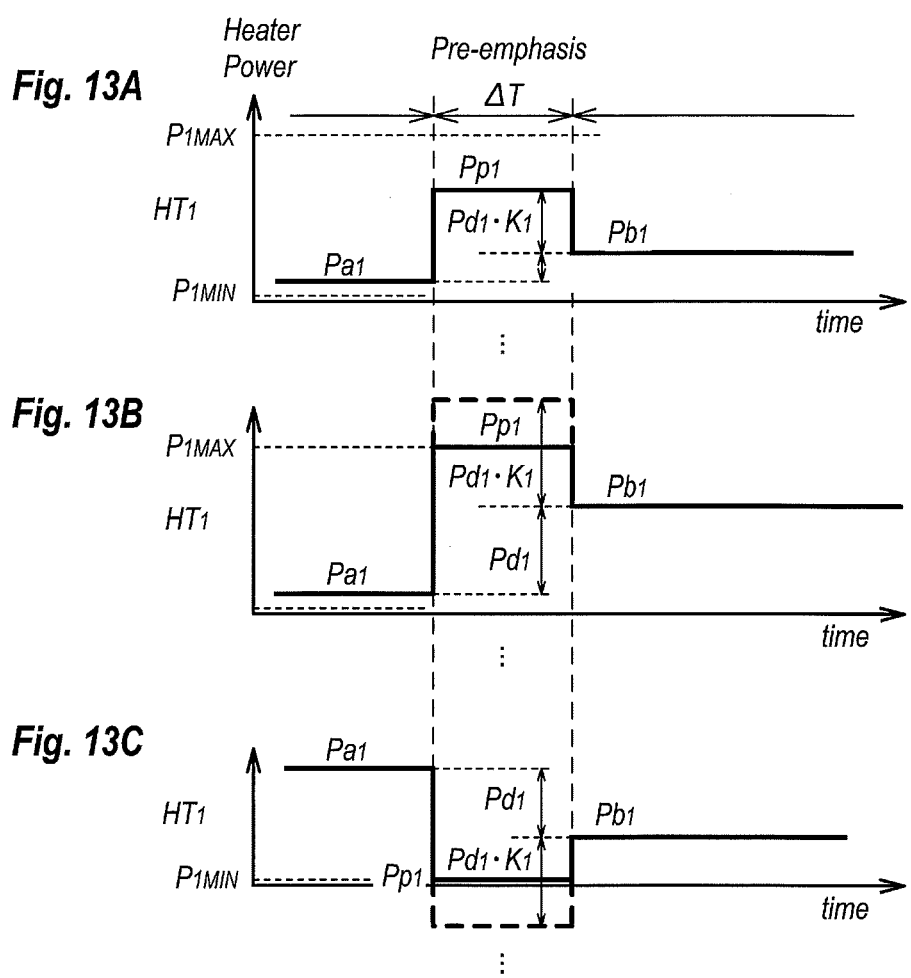

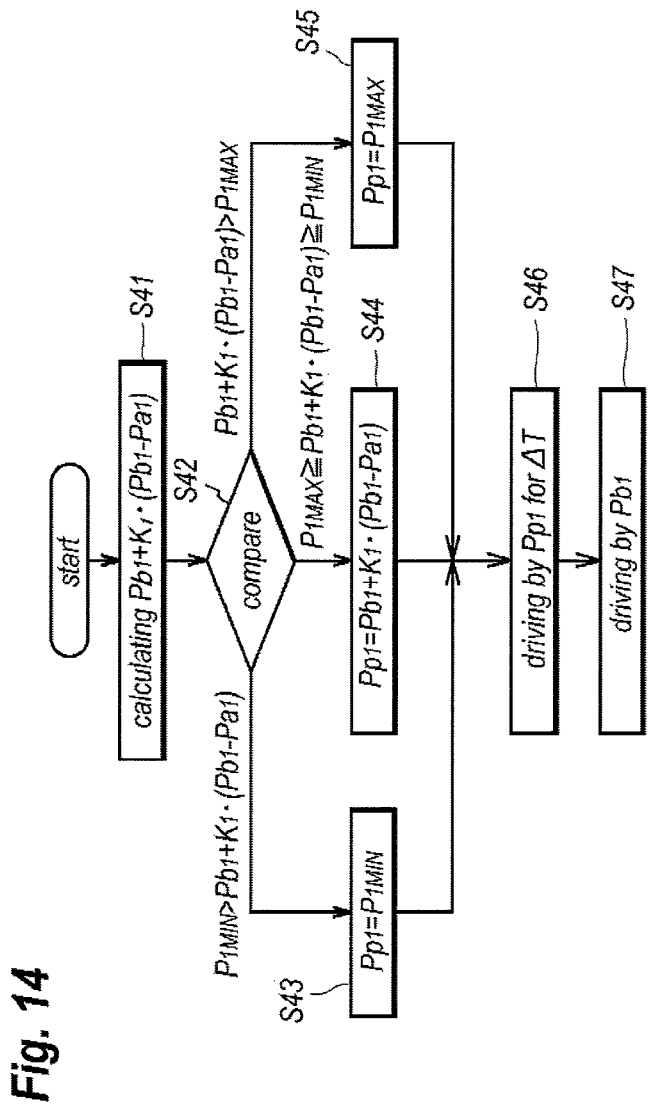

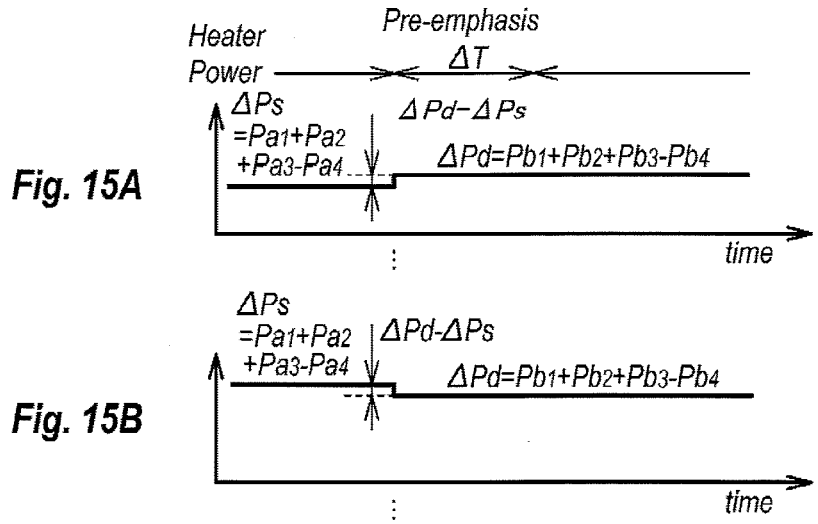
Fig. 15A
Fig. 15B
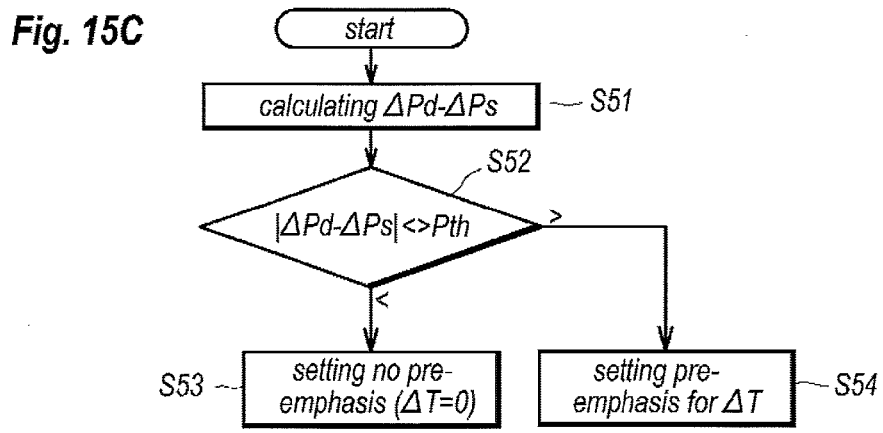
Fig. 15C

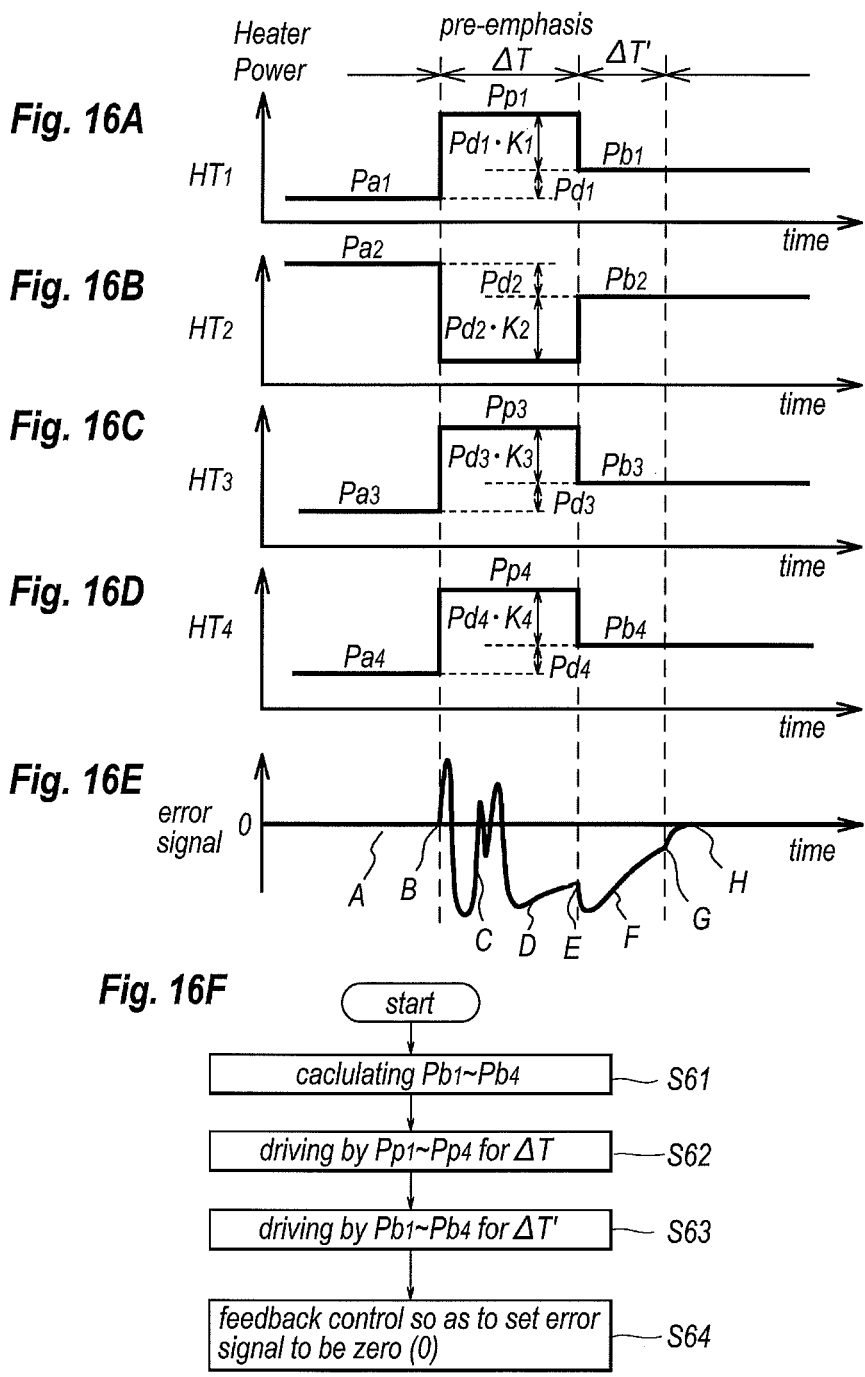

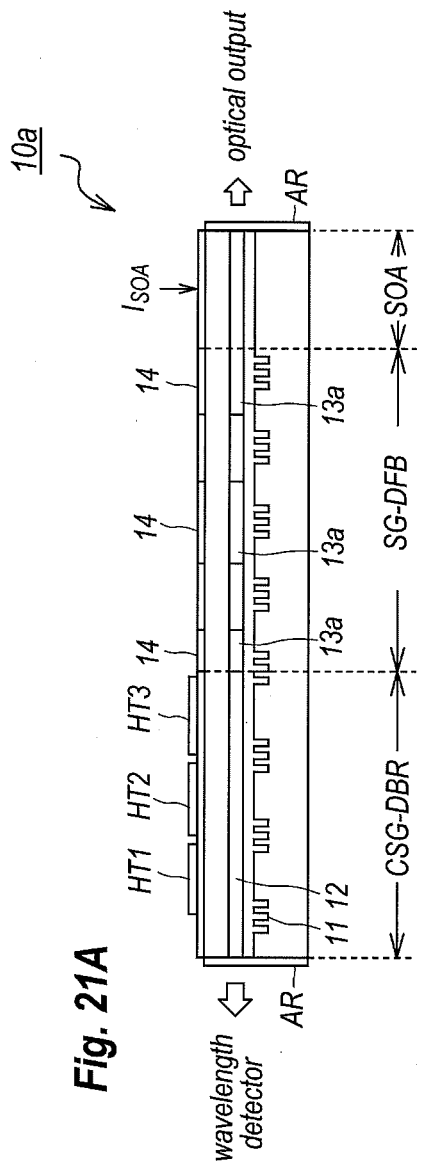
Fig. 21A
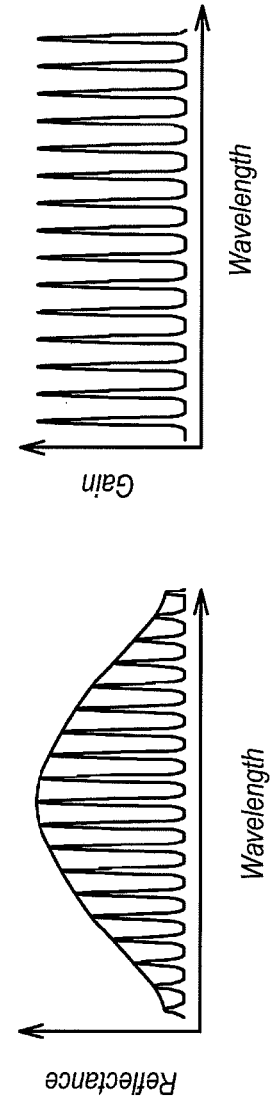
Fig. 21B
Fig. 21C

LASER APPARATUS AND METHOD TO RE-TUNE EMISSION WAVELENGTH TUNABLE LD

CROSS-REFERENCE TO RELATED APPLICATION

This application is based upon and claims the benefit of priority of the prior Japanese Patent Application No. 2014-138000, filed on Jul. 3, 2014, the entire contents of which are incorporated herein by reference.

BACKGROUND

1. Field of the Invention

The present application relates to a laser apparatus and a method to re-tune an emission wavelength of a wavelength tunable LD.

2. Prior Arts

One type of a wavelength tunable semiconductor laser diode (t-LD) has been practically used where the emission wavelength of the t-LD may be tuned by thermally varying the refractive index of semiconductor materials by heaters (for example, see Japanese Patent Application Publication No. 2013-33892). A combination of a chirped sampled grating distributed Bragg reflector (CSG-DBR) and a sampled grating distributed feedback (SG-DFB), where the former device inherently shows a plurality of reflection peaks, while, the latter device shows a plurality of gain peaks, may bring about the Vernier effect between the reflection peaks and the gain peaks. The emission wavelength becomes a wavelength at which one of the reflection peaks coincides with one of the gain peaks. The reflection peaks and the gain peaks may be thermally modified by heat generated by the heaters.

In one application of the t-LD, the re-tune of the emission wavelength has been requested to be done quickly. However, the thermal process inherently shows a longer response from the application of heat to the variation of the refractive index of the semiconductor material. Accordingly, such a t-LD accompanied with heaters to tune the emission wavelength shows a longer period to make the re-tuned emission wavelength in stable.

SUMMARY OF THE INVENTION

One aspect of the present application relates to a laser apparatus that comprises a wavelength tunable laser diode (t-LD) and a controller. The t-LD includes a heater to tune the emission wavelength thereof by being supplied with power. The controller controls the power supplied to the heater to re-tune the emission wavelength by varying the power from the first power Pa to the second power Pb. A feature of the laser apparatus of the present application is that, when the controller supplies the pre-emphasis power Pp before supplying the second power Pb. The pre-emphasis power Pp is set to be greater than the second power Pb when the second power Pb is greater than the first power Pa, but less than the second power Pb when the second power Pb is less than the first power Pa.

Another aspect of the application relates to a method to re-tune the emission wavelength of the t-LD that integrates a heater to modify a temperature of the t-LD. The method comprises steps of: when the t-LD emitting light with a first wavelength stably by being supplied with first power Pa, (a) providing pre-emphasis power Pp for a preset period to the heater by being triggered by a command to re-tune the emission wavelength, and (b) supplying second power Pb to the heater after the preset period passes. A feature of the method is that the pre-emphasis power Pp is greater than the second power Pb when the second power Pb is greater than the first power Pa, but smaller than the second power Pb when the second power Pb is smaller than the first power Pa.

The t-LD of the present application may provide an additional heater. The step of providing the pre-emphasis power Pp may include a step of providing power to the additional heater such that a sum of the first power Pa and power supplied to the additional heater before the trigger becomes equal to a sum of the pre-emphasis power Pp and power supplied to the additional heater during the pre-emphasis. Further, the step of providing the second power Pb may include a step of providing power to the additional heater such that a sum of the pre-emphasis power Pp and the power supplied to the additional heater during the pre-emphasis becomes equal to a sum of the second power Pb and power supplied to the additional heater after the pre-emphasis.

In a modification, the step of providing the pre-emphasis power may include a step of providing power to the additional heater such that a sum of the pre-emphasis power Pp and the power supplied to the additional heater during the pre-emphasis subtracted with a sum of the first power Pa and the power supplied to the additional heater before the pre-emphasis becomes less than the pre-emphasis power Pp subtracted with the first power Pa. Further, the step of providing the second power Pb may include a step of providing the second power Pb such that a sum of the second power Pb and the power supplied to the additional heater after the pre-emphasis subtracted with a sum of the pre-emphasis power Pp and the power supplied to the additional heater during the pre-emphasis becomes less than the second power Pb subtracted with the pre-emphasis power Pp.

BRIEF DESCRIPTION OF THE DRAWINGS

The foregoing and other purposes, aspects and advantages will be better understood from the following detailed description of a preferred embodiment of the invention with reference to the drawings, in which:

FIGS. 4A to 4D show time behaviors of the power supplied to respective heaters, $HT_1$ to $HT_4$, of an example comparable to the present invention, and FIG. 4E shows an example of a deviation of the current wavelength against the target wavelength, and FIG. 4F is a flow chart for switching the target wavelength.

FIGS. 7A and 7B show the pre-emphasis to increase and decrease the power excessively after the trigger of the re-tune, respectively;

FIGS. 8A to 8D show time charts of the power provided to respective heaters, FIG. 8E shows an example of a behavior of the error signal, and FIG. 8F shows a flow chart for the re-tune of the wavelength;

FIGS. 11A and 11B show a case where the power difference for the heaters, $HT_1$ and $HT_2$, between before and after the re-tune is relatively large, while, FIGS. 11C and 11D show another case where the power difference between before and after the re-tune is small, and FIG. 11E is an exemplary flow chart to set a variable coefficient, in a case where the coefficient K may be varied depending on the power difference between before and after the re-tune of the emission wavelength;

FIGS. 12A and 12B show time behaviors of the power supplied to the heater and FIG. 12C is an example of the flow chart to control the heater, in case where when the thermal response of the heaters to raise the temperature is different from that to cool down, the coefficient K is preferably set in different values;

FIGS. 13A to 13C show time behaviors of the power supplied to the heater when an upper and a lower limits are set in the pre-emphasis power;

FIG. 14 shows a flow chart to determine the pre-emphasis power when the upper and lower limits are set;

FIG. 15A shows an example when the power difference becomes a positive small value, and no pre-emphasis is set, FIG. 15B is an example when the power difference becomes a negative small value, and FIG. 15C is the flow chart for the algorithm to omit the pre-emphasis;

FIGS. 16A to 16E show behaviors of the power for the heaters, $HT_1$ to $HT_4$, and the error signal, and FIG. 16F is the flow chart of the control;

FIG. 21A schematically illustrates a cross section of another tunable LD without providing the fourth heater $HT_4$ in the SG-DFB region, and FIGS. 21B and 21C show the reflectance spectrum and the gain spectrum attributed to the CSG-DBR region and the SG-DFB region.

DESCRIPTION OF EMBODIMENTS

Next, some embodiments according to the present application will be described as referring to drawings. In the description of the drawings, numerals or symbols same with or similar to each other will refer to elements same with or similar to each other without duplicated explanations.

First Embodiment

Figure 1A:
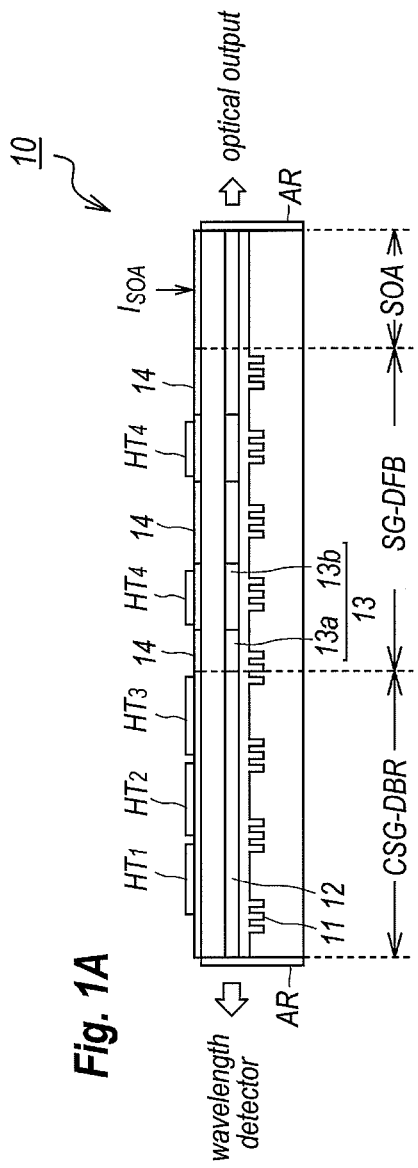
FIG. 1A schematically illustrates a cross section of a wavelength tunable laser diode.

FIG. 1A schematically illustrates a cross section of a wavelength tunable laser diode (hereafter denoted as t-LD) 10, which is implemented within a laser apparatus 100. The t-LD 10 includes a chirped sampled grating distributed Bragg reflector (CSG-DBR) region, a sampled grating distributed feedback (SG-DFB) region, and a semiconductor optical amplifier (SOA), where these regions are arranged along an optical axis of the t-LD 10 in this order. The t-LD 10 further provides an anti-reflection (AR) film in the facet of the CSG-DBR region and another facet of the SOA, where the former facet will be called as the rear facet, and the latter will be called as the front facet. However, the directions of "front" and/or "rear" are only for the explanation sake and will not narrow the scope of the present invention.

The CSG-DBR region provides the sampled grating, which shows no optical gain for the laser emission. The SG-DFB region also provides the sampled grating but accompanies with a substantial optical gain for the laser emission. These two regions of the CSG-DBR region and the SG-DFB region may determine an emission wavelength of the t-LD 10. Specifically, two regions of the CSG-DBR and the SG-DFB provide respective heaters, $HT_1$ to $HT_4$, to vary temperatures of materials thereunder, which changes refractive indices of the materials. Details of the mechanism to tune the emission wavelength will be described later. The SOA region shows a function of the optical amplifier.

Figure 1B:
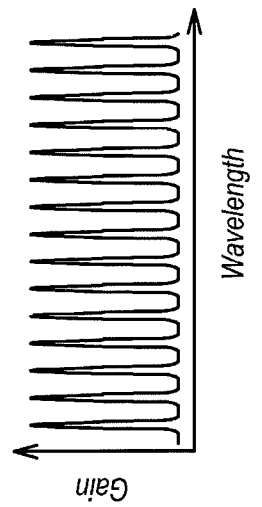
FIG. 1B is a reflection spectrum attributed to the CSG-DBR region and FIG. 1C shows a gain spectrum attributed to the SG-DFB region

The CSG-DBR region provides an optical waveguide 12 including a plurality of first regions each having an optical grating 11 and a plurality of second regions each having no optical grating. The optical waveguide alternately arranges the first regions and the second regions along the optical axis of the t-LD 10. One first region and one second region next to the one first region form one segment. That is, the optical waveguide 12 includes a plurality of segments each comprising the first region including the optical grating and the second region with no optical grating. The optical waveguide 12 is made of material having bandgap energy greater than that corresponding to the emission wavelength, that is, the optical waveguide 12 in the CSG-DBR region is substantially transparent for the light emitted from the t-LD 10. A feature of the CSG-DBR region, at least one of the second regions has a length different from that of the other second regions. The CSG-DBR region having such structures inherently shows a reflectance spectrum containing a plurality of reflection peaks as shown in FIG. 1B. FIG. 1B also indicates an envelope of the reflection peaks. The CSG-DBR region further provides micro-heaters, $HT_1$ to $HT_3$, arranged along the optical axis thereof and on the top surface of the CSG-DBR region. The heaters, $HT_1$ to $HT_3$, locally heat the optical waveguide 12 to modify the refractive indices thereof. Respective heaters, $HT_1$ to $HT_3$, are independently supplied and controlled with power.

The SG-DFB region provides another optical waveguide 13 that comprises a plurality of gain regions $13a$ and a plurality of passive regions $13b$ alternately arranged along the optical axis of the optical waveguide 13. Each of the gain regions $13a$ and each of the passive regions $13b$ include a diffraction grating. The gain regions $13a$ each has an optical gain for the laser oscillation, while, the passive regions $13b$ each shows no optical gain. Specifically, the gain regions each provides an electrode 14 on a top surface thereof through which carriers are injected into the gain regions. On the other hand, the passive regions each provides a heater $HT_4$ on the top surface thereof similar to those provided in the CSG-DBR region. However, the heaters $HT_4$ are commonly supplied and controlled in the power thereof. The SG-DFB region thus configured inherently shows a gain spectrum including a plurality of gain peaks, which is shown in FIG. 1C.

Figure 1C:
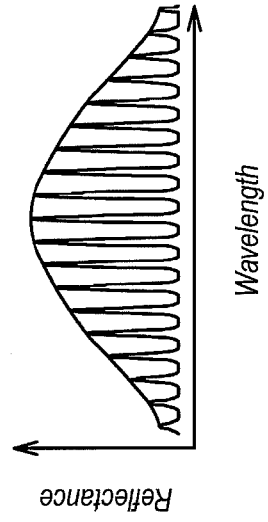

The reflection peaks shown in FIG. 1B attributed to the CSG-DBR region and the gain peaks shown in FIG. 1C attributed to the SG-DFB region have respective spans different from the other. Respective heaters, $HT_1$ to $HT_3$, and $HT_4$ may vary temperatures of the materials therebeneath and vary the refractive indices thereof, which shift the positions of respective peaks. Accordingly, by adjusting the power supplied to the heaters, $HT_1$ to $HT_3$, and $HT_4$, one of reflection peaks coincides with one of gain peaks. The t-LD 10 may emit laser light with the wavelength at which the reflection peak coincides with the gain peak. A periodic reflection spectrum of the CSG-DBR region and a periodic gain spectrum attributed to the SG-DFB region each causes many wavelengths equivalent to each other, that is, even when the one wavelength is determined by the mechanism above described, other wavelengths, which are apart from the one wavelength above described by the minimum common multiple of the span between the reflection peaks and another span of the gain peaks, become wavelengths equivalent to the one wavelength. The t-LD 10 selects one of those wavelengths equivalent to each other at which a product of the reflectance and the gain becomes the maximum.

Figure 2:
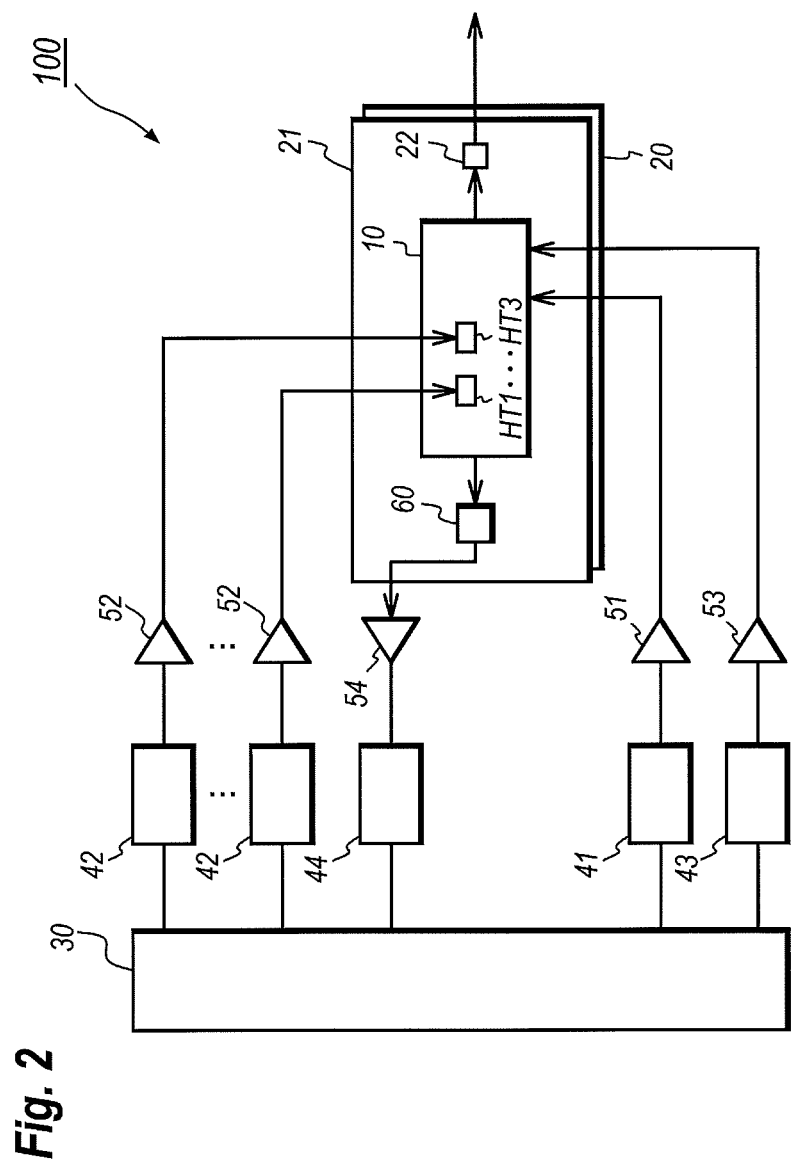
FIG. 2 is a schematic block diagram of the laser apparatus.

FIG. 2 is a schematic block diagram of the laser apparatus 100. The laser apparatus 100 of the present embodiment provides the t-LD 10, a thermo-electric cooler (TEC) 20 including a Peltier device, a controller 30, some digital-to-analog converters (D/A-C), 41 to 43, an analog-to-digital converter 44, some amplifiers, 51 to 54, and a wavelength detector 60.

The TEC 20 mounts the t-LD 10 through a carrier 21 thereon. Thus, the TEC 20 may control a temperature of the t-LD 10 as a whole. The controller 30, which may be a field programmable gate array (FPGA), injects currents into the gain region 13a of the t-LD 10 through the D/A-C 41 and the amplifier 51 to set the optical gain of the gain region 13a greater than unity. Also, the controller 30 provides heater currents in the heaters, $HT_1$ to $HT_3$, through the D/A-C 42 and the amplifier 52 to tune the emission wavelength of the t-LD 10. The laser apparatus 100, thus provides the D/A-Cs 42 and the amplifiers 52, the counts of which are the same as the counts of the heaters that the t-LD 10 implements. The controller 30 may adjust the output power of the t-LD 10 by supplying a bias current to the SOA region through another D/A-C 43 and the amplifier 53.

The t-LD 10 outputs the front light thereof through an optical isolator 22 also mounted on the carrier 21, and provides the back light to the wavelength detector 60. The wavelength detector 60 determines a difference between a wavelength that is currently output from the t-LD 10 and a target wavelength by the arrangement including the etalon filter and photodiodes, and provides thus determined difference to the controller 30 as an error signal through the amplifier 54 and an A/D-C 44. The controller 30 adjusts the power supplied to respective heaters, $HT_1$ to $HT_3$, such that the difference above described becomes smaller or zero. Thus, the controller 30 may set the current wavelength in the target wavelength.

Figure 3:
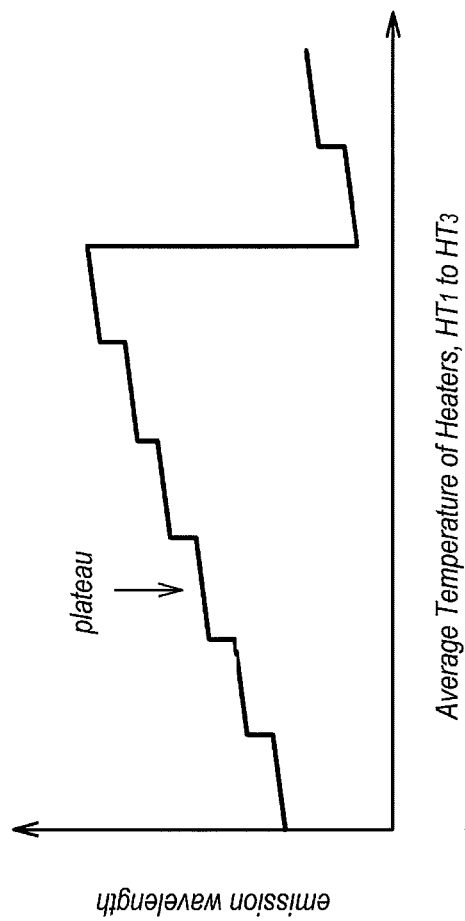
FIG. 3 shows an example of a relation of the average temperature of the heaters, $HT_1$ to $HT_3$, and the emission wavelength of the t-LD.

FIG. 3 shows an example of a relation of the power supplied to the heaters, $HT_1$ to $HT_3$, equivalently, an average temperature of the heaters, $HT_1$ to $HT_3$, and the emission wavelength of the t-LD 10. The horizontal axis in FIG. 3 denotes an average temperature of the heaters, $HT_1$ to $HT_3$, and the vertical axis corresponds to the emission wavelength of the t-LD 10. In FIG. 3, the last heater $HT_4$ is assumed to be set constant in a temperature thereof, and the temperature of the t-LD 10 is also assumed to be set constant by the TEC 20. The t-LD 10, as already described emits the laser light with the wavelength at which one of the reflection peaks attributed to the CSG-DBR region coincides with one of gain peaks attributed to the SG-DFB region. Accordingly, the t-LD 10 is able to emit the laser light with one of the wavelengths distributing by a constant pitch.

In FIG. 3, regions with a smaller temperature dependence of the emission wavelength are called as plateaus. A target wavelength is often set in a center of respective plateaus. When the target wavelength is changed, the power supplied to the heaters, $HT_1$ to $HT_3$, is first adjusted such that the current emission wavelength is within the plateau where the target wavelength is involved; then, a feedback control from the detection of the wavelength difference between the current emission wavelength and the target wavelength to the adjustment of the power supplied to the heaters, $HT_1$ to $HT_3$, may precisely adjust the current wavelength in the target wavelength within the target plateau.

Next, details of the re-tune to set the current wavelength in the target wavelength will be described. Recently, various applications of a wavelength tunable LD requests a short time completion of the re-tune of the target wavelength. However, a t-LD implementing heaters to tune the emission wavelength is inherently hard to complete the re-tune shorter than one millisecond, because of a thermal process of controlling a temperature of regions by heaters.

FIGS. 4A to 4D show time behaviors of the power supplied to respective heaters, $HT_1$ to $HT_4$, of an example comparable to the present invention, and FIG. 4E shows an example of an error signal corresponding to a deviation of the current wavelength from the target wavelength, and FIG. 4F is a flow chart for re-tuning the target wavelength.

At a period A before the beginning of the re-tune, a t-LD may stably emit light with a target wavelength within one of plateaus, and the error signal is maintained in substantially zero. Under such a status, the controller 30 provides the power of $Pa_1$ to $Pa_4$ to respective heaters, $HT_1$ to $HT_4$, at step S1. Then, the controller 30, responding to a command to re-tune the target wavelength begins procedures at the time B in step S2.

The controller 30 first stops the feedback control of the heaters, $HT_1$ to $HT_4$. Assuming the power first supplied to the heaters, $HT_1$ to $HT_4$, are $Pa_1$ to $Pa_4$, respectively, the controller 30 constantly and stably supplies the power, $Pb_1$ to $Pb_4$, to the heaters, $HT_1$ to $HT_4$, at step S3 for a period ΔT' until the emission wavelength enters in the plateau where the target wavelength is involved, then, the feedback control is resumed. At the time C after the beginning of the re-tune, the emission wavelength of the t-LD 10 fluctuates and does not stay within the target plateau where the target wavelength is involved due to transient thermal process caused by the change of the supplied power, which results in large oscillations of the error signal shown in FIG. 4E. Under such conditions, the feedback control of the emission wavelength is unable to start. Accordingly, the controller 30 sets the power supplied to the heaters, $HT_1$ to $HT_4$, in constant.

Once hopping the emission wavelength within the target plateau at the time D, the emission wavelength reduces the fluctuation thereof. At the time E, namely, at the end of the period ΔT', the controller 30 begins the feedback control of the heaters, $HT_1$ to $HT_4$, so as to coincide the emission wavelength with the target wavelength at step S4. Then, the emission wavelength becomes stable at the time F. The period ΔT' strongly depends on a difference of the power supplied to the heaters, $HT_1$ to $HT_4$, between before and after the beginning of the re-tune of the emission wavelength. Assuming that $\Delta Ps=PA_1+PA_2+PA_3-PA_4$ and $\Delta Pd=PB_1+PB_2+PB_3-PB_4$, the period ΔT' becomes longer as a difference between two difference |ΔPd-ΔPs| becomes large.

An embodiment of the present application sets a pre-emphasis in the power supplied to the heaters, $HT_1$ to $HT_4$, just after the beginning of the re-tune of the target wavelength to shorten a period until the emission wavelength becomes stable. That is, the controller 30, when the power supplied to the heaters from a value Pa to another value Pb before and after the beginning of the re-tune, supplies third power Pp for a preset period just after the beginning of the re-tune, where the third power Pp is greater than the power Pb (Pp>Pb) when the final power Pb is greater than the initial power Pa supplied before the re-tune, and smaller than the power Pb (Pp<Pb) when the final power Pb supplied after the beginning of the re-tune is smaller than the initial power Pa supplied before the re-tune.

Figure 5A:
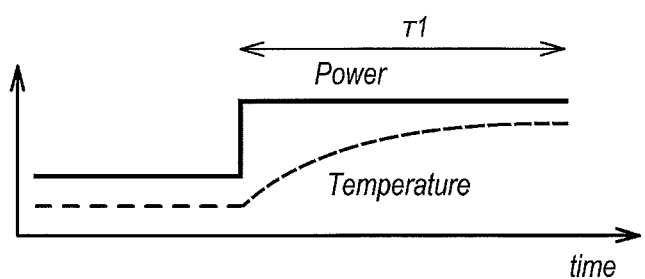
FIGS. 5A and 5B accompanied with no pre-emphasis is set in the control of the heaters compare with FIG. 5C that sets the pre-emphasis when the power after the trigger of the re-tune of the emission wavelength increases.
Figure 5B:
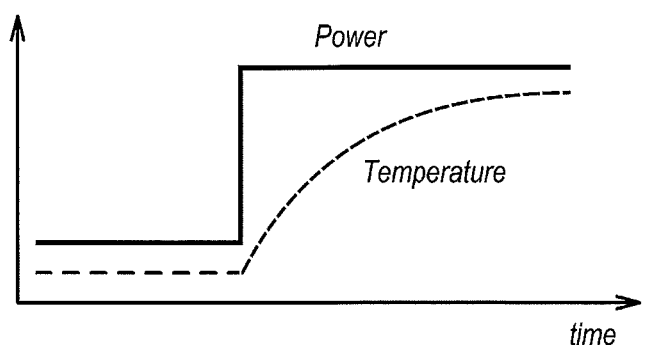
Figure 5C:
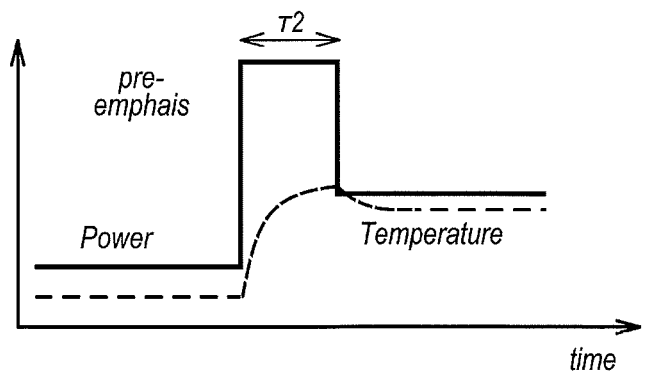

FIGS. 5A to 6C compare two cases, one of which sets the pre-emphasis, while, the other omits the pre-emphasis. As shown in FIGS. 5A and 5B, when the power supplied to the heater with no pre-emphasis, a time τ1 to stabilize the temperature in a predetermined one becomes long. Increasing the power to the heaters, the rise of the temperature becomes steep, namely, the rising rate of the temperature becomes large, but the time τ1 to stabilize the temperature is prolonged. Setting the power to the heaters temporarily as a pre-emphasis in a value greater than that corresponding to a new target wavelength, as shown in FIG. 5C, the change rate of the temperature may be enhanced, which resultantly shortens the period τ1 to stabilize the temperature of the heaters in the target temperature.

Figure 6A:
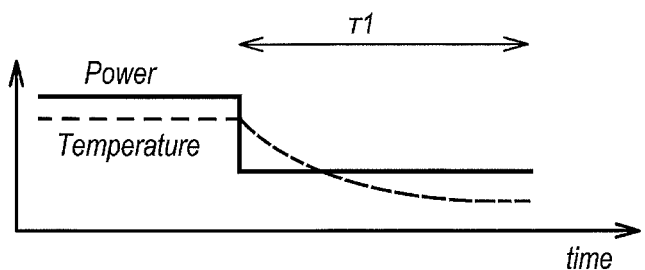
FIGS. 6A and 6B accompanied with no pre-emphasis is set in the control compare with FIG. 6C with the pre-emphasis when the power after the trigger of the re-tune of the emission wavelength decreases.
Figure 6B:
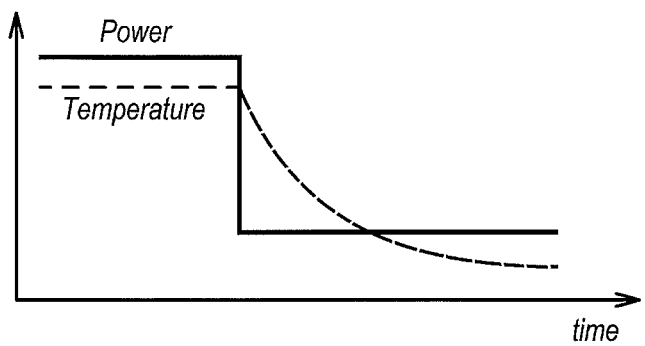
Figure 6C:
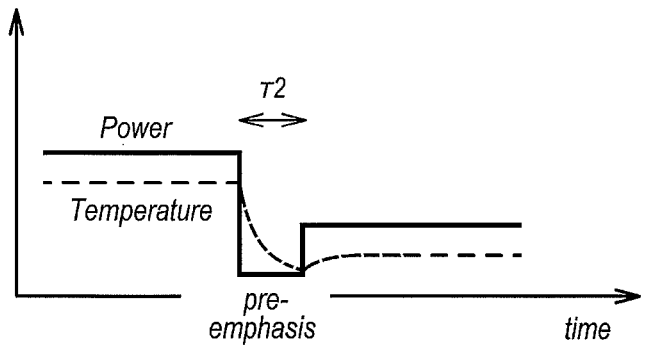

An algorithm described above may be similarly applied to a case when the temperature of the heater is lowered. As shown in FIG. 6A, reducing the power to the heater without accompanying with any pre-emphases, the period τ1 until the temperature of the heater becomes stable is prolonged. This phenomenon is invariant even when the power is largely decreased because the target heater temperature is largely lowered as shown in FIG. 6B. The present embodiment shown in FIG. 6C sets the pre-emphasis for a preset period just after the target temperature is changed to lower the temperature of the heater drastically; then, the power to the heater is set in the final value corresponding to the new target temperature. FIG. 6C illustrates a case where the temperature of the heater is excessively lowered by the pre-emphasis. But, the function of the pre-emphasis is still effective for a case where the temperature of the heater is not excessively lowered.

As shown in FIG. 7A, assuming that Pa and Pb are the power supplied to the heater before and after the re-tune of the emission wavelength, respectively; a difference Pd of two values may be given by Pd=Pb−Pa, and the power Pp supplied to the heater during the period ΔT of the pre-emphasis may be obtained by an equation (1) below:

$$Pp=Pb+K\cdot Pd=Pb+K\cdot(Pb-Pa). \quad (1)$$

As shown in FIG. 7B, on the other hand, when the power to the heater is lowered after the re-tune of the emission wavelength, the difference Pd is denoted as Pd=Pa−Pb, and the pre-emphasis power Pp is given by:

$$Pp=Pb-K\cdot Pd=Pb-K\cdot(Pa-Pb). \quad (2)$$

From two equations, (1) and (2), the pre-emphasis power Pp during the pre-emphasis may be denoted as:

$$Pp=Pb+K\cdot(Pb-Pa). \quad (3)$$

The t-LD 10 according to the present embodiment provides four (4) heaters to be supplied with new respective power at the re-tune of the wavelength. FIGS. 8A to 8D show time behaviors of the power provided to respective heaters, $HT_1$ to $HT_4$, FIG. 8E shows an example of a behavior of the error signal, and FIG. 8F is a flow chart for the re-tune of the emission wavelength according to the present embodiment.

In the period A before the triggering of the re-tune, the emission wavelength is stable in one of plateaus to show a relatively small, or nearly zero deviation from the target one. The controller 30 sets the power, $Pa_1$ to $Pa_4$, to respective heaters, $HT_1$ to $HT_4$ in this period A, which corresponds to the step S11 in FIG. 8F. The controller 30 begins the re-tune of the emission wavelength at the time B in step S12. In an example shown in the figures, the controller 30 increases the power for the heaters, $HT_1$, $HT_3$, and $HT_4$, but decreases the power of the heater $HT_2$. Assuming those power for the new target wavelength are $Pb_1$ to $Pb_4$, the controller 30 determines at step S13 the power $Pp_1$ to $Pp_4$ during the pre-emphasis period from the power before and after the triggering, $Pa_1$ to $Pa_4$ and $Pb_1$ to $Pb_4$, respectively.

Then, the controller 30 supplies the power, $Pp_1$ to $Pp_4$, to respective heaters, $HT_1$ to $HT_4$, during the period ΔT of the pre-emphasis at step S14. As shown in FIG. 8E, the emission wavelength of the t-LD 10 becomes unstable for a period C just after the beginning of the re-tune because of transient thermal instability by the change of the power supplied to the heaters, $HT_1$ to $HT_4$, which means that the emission wavelength may hop between the plateaus show in FIG. 3. However, the emission wavelength once hops within the target plateau at the time D, the emission wavelength becomes stable by the Vernier effect of the t-LD 10. The period of the pre-emphasis terminates at the time E and the controller 30 sets at step S15 the power to the heaters, $HT_1$ to $HT_4$, in the target ones, $Pb_1$ to $Pb_4$, corresponding to the target wavelength. The emission wavelength gradually comes close to the target wavelength within the target plateau in the period F, and finally substantially coincides with or at least within an acceptable error range to the target wavelength at the time G.

Figure 9:
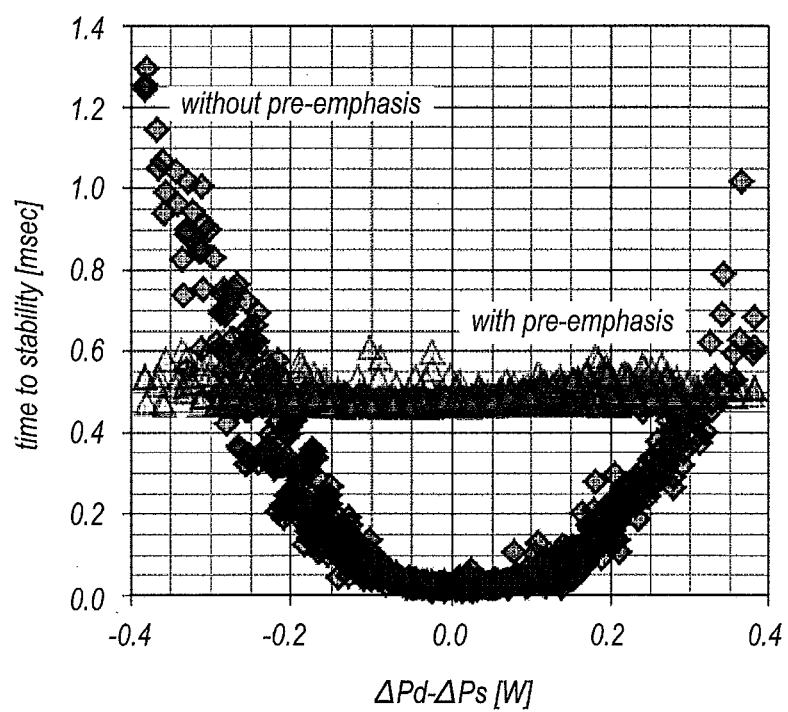
FIG. 9 compares the time until the emission wavelength becomes substantially equal to the target wavelength when the pre-emphasis is set or not.

FIG. 9 compares the time until the emission wavelength becomes substantially equal to the target wavelength from the beginning of the re-tune in two cases, namely, in a case where the pre-emphasis is set and another case when no pre-emphasis is set. Exact 630 combinations of wavelengths before and after the re-tune were evaluated. When no pre-emphasis is set, a larger difference of the power difference before and after the re-tune, ΔPd−ΔPs, causes a longer time to make the emission wavelength stable, where the power difference is a difference of a sum of the power supplied to the heaters in the CSG-DBR region from the power supplied to the heater in the SG-DFB region, that is, $\Delta Pd=Pb_1+Pb_2+Pb_3-Pb_4$ and $\Delta Ps=Pa_1+Pa_2+Pa_3-Pa_4$. Some combinations show the time exceeding 1.0 millisecond. On the other hand, when the pre-emphasis is set, the time to the stable target wavelength becomes longer compared to that for the case of no pre-emphasis in a region relatively smaller power difference ΔPd−ΔPs. The set of the period of the pre-emphasis is indispensable for controlling the heater power. However, the time until the stable emission wavelength becomes substantially independent of the power difference, $\Delta Pd-\Delta Ps$, and equal to the period $\Delta T$ of the pre-emphasis.

Figure 10A:
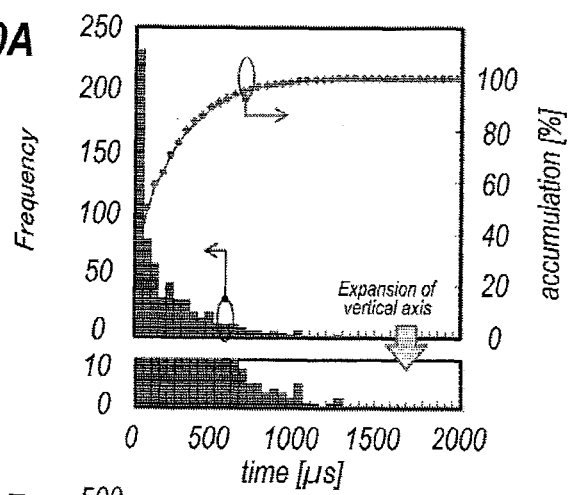
FIGS. 10A and 10B are the histograms of the time to make the emission wavelength stable, when the control excludes the pre-emphasis in FIG. 10A and includes the pre-emphasis in FIG. 10B.
Figure 10B:
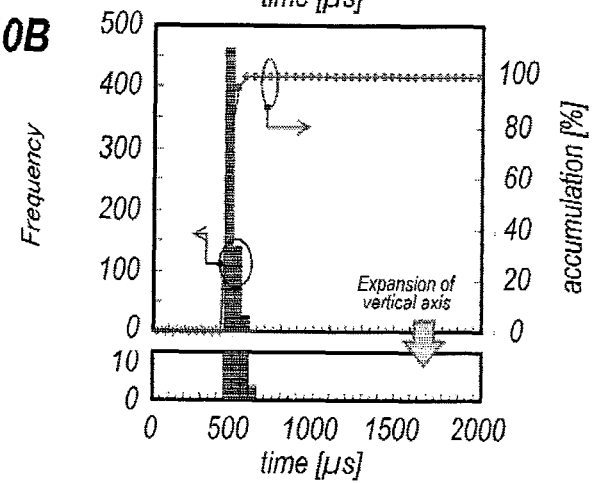

FIGS. 10A and 10B are the histograms of the time until the stable emission wavelength. Without the pre-emphasis, which corresponds to FIG. 10A, the time scattered from 10 to 1300 microseconds ($\mu$ sec) whose standard deviation was 240 µsec. On the other hand, setting the pre-emphasis, the time converges within a range of 460 to 650 µsec with the standard deviation of 27 µsec. The experiment shown in FIGS. 9 and 10 set the conditions of the pre-emphasis, namely, the period $\Delta T$ and the co-efficient K, were experimentally determined to be 450 µsec and 1.75, respectively.

Thus, when the t-LD is re-tuned in the emission wavelength thereof, the embodiment of the present invention supplies the power Pp to the heater for a preset period before the target power Pb corresponding to the target wavelength is supplied. When the target power Pb is greater than the current power Pa, namely Pa<Pb, the temporal pre-emphasis power Pp is greater than the target power, namely, Pp>Pb. On the other hand, when the target power Pb is smaller than the current power Pa, Pa>Pb, the temporal pre-emphasis power Pp is set to be smaller than the target power, Pp<Pb. The algorithm to provide the pre-emphasis power Pp to the heater in advance to the target power Pb may shorten the time to set the emission wavelength within the target plateau, and to set the emission wavelength in stable in the target wavelength.

First Modification of First Embodiment

The embodiment thus described sets the coefficient K for determining the pre-emphasis power in common to all heaters, $HT_1$ to $HT_4$. However, the coefficient K may be respectively set for the heaters, $HT_1$ to $HT_4$. Respective heaters, $HT_1$ to $HT_4$, sometimes show thermal response different from others. In such a status, respective heaters, $HT_1$ to $HT_4$, attributed to coefficients K specific thereto become valuable for shortening the time to the stable emission wavelength. The controller 30 may calculate respective coefficients $K_n$ where n=1 to 4, or may hold the coefficients $K_n$ determined in advance to the practical operation of the t-LD 10.

Second Modification of First Embodiment

The coefficient K may be varied depending on the power difference between before and after the re-tune of the emission wavelength. When the thermal response of the heaters, $HT_1$ to $HT_4$, is non-linear to the power supplied thereto, the variable co-efficient K is effective to shorten the time to the stable emission wavelength. FIGS. 11A and 11B show a case where the power difference for the heaters, $HT_1$ and $HT_2$, between before and after the re-tune is relatively large, while, FIGS. 11C and 11D show another case where the power difference between before and after the re-tune is small. When the power difference $Pd_n$ where n=1 to 4 is small, which results in smaller power $Pp_n$ during the pre-emphasis, the coefficients $K_n$ are set to be large to get enough pre-emphasis power.

FIG. 11E is an exemplary flow chart to set a variable coefficient. The flow chart of FIG. 11E concentrates on the heater $HT_1$, but the control shown in FIG. 11E may be applicable to the rest of the heaters, $HT_2$ to $HT_4$. The controller 30, receiving the command to re-tune the emission wavelength, first calculates the power difference $Pd_1$ between before and after the re-tune, namely, $Pd_1=Pb_1-Pa_1$ at step S21, then, determines the co-efficient $K_1$ by a calculation or by referring to the look-up-table at step S22. The controller 30 further determines the power $Pp_1$ during the pre-emphasis by applying thus determined coefficient $K_1$ to the power difference $Pd_1$ at step S23, and first supplies thus calculated power $Pp_1$ to the heater $HT_1$ for the period $\Delta T$ then the power $Pb_1$ corresponding to the target wavelength.

Third Modification of First Embodiment

When the thermal response of the heaters to raise the temperature is different from that to cool down, the coefficient K is preferably set in different values. FIGS. 12A and 12B show time behaviors of the power supplied to the heater and FIG. 12C is an example of the flow chart to control the heater. In this example, the controller 30 uses one coefficient K' in the case of Pa<Pb, namely, for raising the temperature, but sets another coefficient K" ($\neq$K') in the case of Pa>Pb, namely, for cooling down the temperature. When the system including the heater and the semiconductor materials to be varied in the temperatures thereof is hard to cool down the temperature but relatively easy to raise the temperature, the controller 30 may be effectively distinguish the coefficients, K' and K", for the pre-emphasis. FIG. 12A is an example to raise the temperature by the co-efficient K', and FIG. 12B is an example to fall the temperature down by the co-efficient K".

As shown in FIG. 12C, the controller 30, receiving the command to re-tune the emission wavelength, first calculates a power difference, $Pd_1=Pb_1-Pa_1$, at step S13. Then, the controller 30, depending on the polarity of the power difference $Pd_1$, selects one of the coefficients, $K_1'$ and $K_1''$, at step S32, and calculates the pre-emphasis power $Pp_1$ according to equation (3) above described by thus determined coefficient at step S33. The controller 30 supplies the calculated pre-emphasis power $Pp_1$ to the heater $HT_1$ for the period of $\Delta T$ at step S32, and finally recovers the power $Pb_1$ corresponding to the target emission wavelength at step S35. The description above concentrates on the first heater $HT_1$, but, the algorithm thus described may be applied to the other heaters, $HT_2$ to $HT_4$.

Fourth Modification of First Embodiment

When the capacity of the heaters, $HT_1$ to $HT_4$, and/or drive capability for the heaters is restricted, enough pre-emphasis power is no longer hard or impossible to be supplied to the heaters, $HT_1$ to $HT_4$. In particular, when the final power is less than the initial power, Pa>Pb, the equation to determine the pre-emphasis power Pp possibly results in a negative value, which is logically unrealizable to supply to the heater. An additional device, such as a Peltier cooler, may generate a negative pre-emphasis, but, inevitably accompanies with additional power consumption. One algorithm to set an upper limit and a lower limit of the pre-emphasis power may effectively control the temperature of the heater.

FIGS. 13A to 13C show time behaviors of the power supplied to the heater when an upper limit and a lower limit are set in the pre-emphasis power. FIG. 13A shows an example of the heater power when the pre-emphasis power $Pp_1$ for the heater $HT_1$ is set between the upper and lower limits, $P_{1MAX}$ and $P_{1MIN}$, respectively. In such a case, the pre-emphasis power $Pp_1$ may be determined according to equation (3) above described. FIG. 13B is another example when the pre-emphasis power calculated by equation (3) exceeds the upper limit $P_{1MAX}$, and the practical pre-emphasis power $Pp_1$ is restricted to the upper limit $P_{1MAX}$. FIG. 13C is still another example when the calculated pre-emphasis power becomes less than the lower limit $P_{1MIN}$, or negative. In such a case, the practical pre-emphasis power $Pp_1$ is set in the lower limit $P_{1MIN}$.

FIG. 14 shows a flow chart to determine the pre-emphasis power when the upper and lower limits are set. The controller 30 first calculates the pre-emphasis power according to equation (3) above at step S41, and compares thus calculated pre-emphasis power with the upper and lower limits, $P_{1MAX}$ and $P_{1MIN}$, respectively, at step S42. When the calculated power is less than the lower limit $P_{1MIN}$, the controller 30 sets the pre-emphasis power $Pp_1$ in the lower limit $P_{1MIN}$ thereof at step S43. On the other hand, when the calculated power exceeds the upper limit $P_{1MAX}$, the controller 30 sets the pre-emphasis power $Pp_1$ in the upper limit $P_{1MAX}$ thereof (step S45). Finally, when the calculated power is between the upper and lower limits, the controller 30 sets the value calculated in step S41 as the pre-emphasis power $Pp_1$ (step S44). Subsequently, the controller 30 supplies thus determined pre-emphasis power $Pp_1$ to the heater $HT_1$ for the period $\Delta T$ after the triggering of the re-tune of the emission wavelength (step S46); then, sets the heater power $Pb_1$ corresponding to the re-tuned wavelength at step S47. When the t-LD 10 implements the Vernier effect to tune the emission wavelength thereof, the heater power supplied to respective heaters to satisfy the Vernier effect has substantial tolerance. Accordingly, the re-tuning of the emission wavelength may be effectively carried out even for the limited pre-emphasis power.

Fifth Modification of First Embodiment

Next, the fifth modification of the first embodiment will be described. As explicitly shown in FIG. 9, the pre-emphasis does not always shorten the time to the stable re-tuned wavelength, or the stable temperature of the heaters. In an example using the t-LD 10 shown in FIG. 1, the time to the stable re-tuned wavelength depends on the difference $\Delta Pd - \Delta Ps$ between the power supplied to the heater after and before the re-tuning. Accordingly, setting the period $\Delta T$ for the pre-emphasis to be zero, that is, no pre-emphasis is set after the re-tuning when the difference $\Delta Pd - \Delta Ps$ is small; the time to the stable re-tuned emission wavelength may reflect the performance that the t-LD 10 originally provides.

FIG. 15A shows an example when the power difference $\Delta Pd - \Delta Ps$ is calculated in a positive small value, and no pre-emphasis is set, while, FIG. 15B is an example when the power difference $\Delta Pd - \Delta Ps$ becomes a negative small value. FIG. 15C is a flow chart for the algorithm to omit the pre-emphasis. As shown in FIG. 15C, the controller 30 first calculates the difference of the power supplied in the CSG-DBR region and that in the SG-DFB region before and after the pre-emphasis, $\Delta Ps$ and $\Delta Pd$, respectively, and the difference between these two values $\Delta Pd - \Delta Ps$, at step S51. Next, at step S52, the absolute of the difference $|\Delta Pd - \Delta Ps|$ is compared with a threshold. When the absolute is less than the threshold, the controller supplies at step S53 the final power, $Pb_1$ to $Pb_4$, to the heaters, $HT_1$ to $HT_4$, without setting the pre-emphasis. On the other hand, when the absolute is greater than the threshold, the controller 30 sets the pre-emphasis power, $Pp_1$ to $Pp_4$, in respective heaters, $HT_1$ to $HT_4$, for the period of $\Delta T$, then provides the power, $Pb_1$ to $Pb_4$, which corresponds to the re-tuned wavelength to the heaters, $HT_1$ to $HT_4$ (step S54).

Sixth Modification of First Embodiment

The method according to the present application may provide, after a preset time $\Delta T'$ for providing the constant power $Pb_n$ corresponding to the re-tuned emission wavelength, a period to set the feedback control of the power to the heaters, $HT_1$ to $HT_4$. FIGS. 16A to 16E show time behaviors of the power for the heaters, $HT_1$ to $HT_4$, and the error signal, and FIG. 16F shows the flow chart of the control. As shown in the flow chart of FIG. 16F, the controller 30 first calculates the pre-emphasis power, $Pp_1$ to $Pp_4$, according to equation (3) above by respective power before and after the re-tune, $Pa_1$ to $Pa_4$ and $Pb_1$ to $Pb_4$, at step S61. The controller 30 supplies thus calculated pre-emphasis power $Pp_1$ to $Pp_4$ for the period $\Delta T$ after the time B by stopping the feedback control of the power $Pa_1$ to $Pa_4$ for the heaters, $HT_1$ to $HT_4$, before the triggering of the re-tune at step S62 and subsequently supplies the constant power $Pb_1$ to $Pb_4$ corresponding to the re-tuned emission wavelength at step S63. During the period F for supplying the constant power $Pb_1$ to $Pb_4$, the error signal gradually comes closer to zero, which means that the emission wavelength of the t-LD 10 gradually coincides with the target wavelength within the plateau in FIG. 3 that involves the target wavelength. Then, at the time G after passing the period $\Delta T'$, the controller 30 begins the feedback control such that the error signal further comes closer to zero at step S64. Accordingly, the emission wavelength becomes the target wavelength, that is, the error signal becomes substantially zero, at the time H which is further shorter than the time H in the embodiments shown in FIG. 8.

Second Embodiment

In the previous embodiment, the t-LD 10 is set on a temperature controller (TEC) 20 to maintain the temperature of the t-LD 10 in constant. Under such arrangement, the re-tune of the emission wavelength causes a fluctuation in the thermal condition, in particular, the heat capacity of the members placed on the temperature controller (TEC) 20 is modified, which induces a transitional deviation of the temperature of the t-LD 10. This temperature deviation may be finally compensated by the feedback control of the temperature controller (TEC) 20 by a relatively longer time constant, which sometimes exceeds several seconds. The emission wavelength of the t-LD 10 shifts during the compensation by the feedback control. Accordingly, the second embodiment of the present application provides, to compensate this transitional deviation in the emission wavelength, a dummy heater on the temperature controller (TEC) 20.

Figure 17:
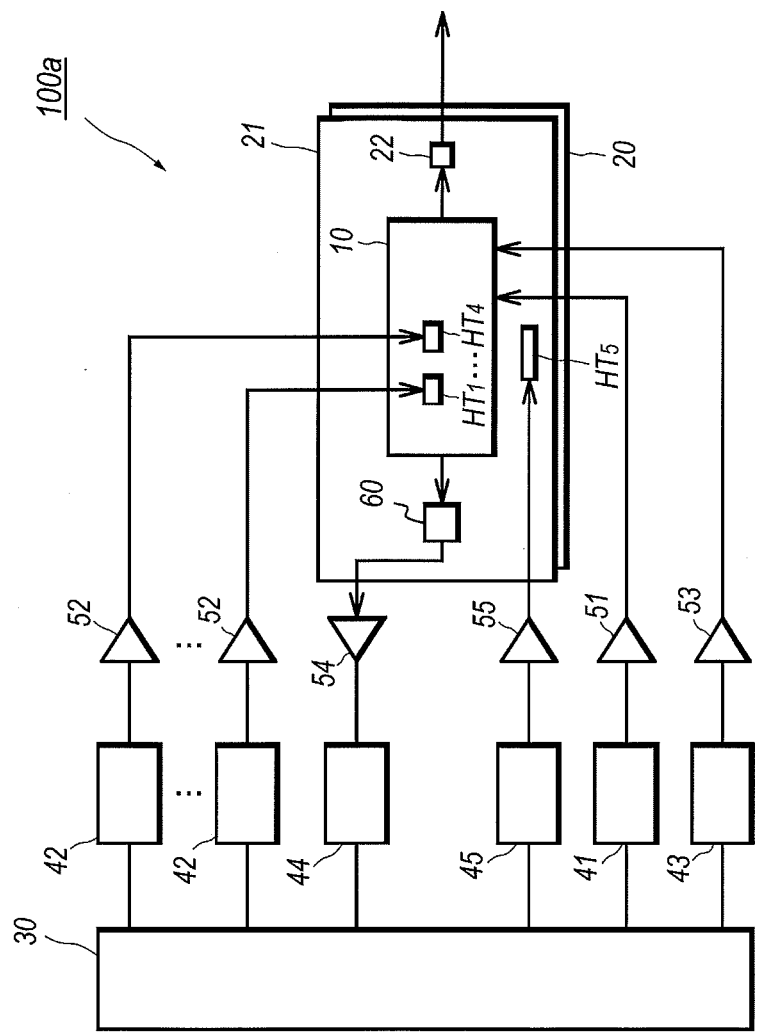
FIG. 17 shows a functional block diagram of another laser apparatus, which has a feature distinguishable from the first embodiment shown in FIG. 2 in a point that the apparatus provides a supplemental heater $HT_5$ operable as a dummy heater.

FIG. 17 shows a functional block diagram of a laser apparatus 100a, which has a feature distinguishable from that of the first embodiment in a point that the laser apparatus 100a provides a heater $HT_5$ operable as a dummy heater on the temperature controller (TEC) 20, and the controller 30 is further implemented with a digital-to-analog converter (D/A-C) 45 and an amplifier 55 for the heater $HT_5$. The controller 30 supplies power to the heater $HT_5$ such that, at the re-tune of the emission wavelength, a sum of the power supplied to the heaters, $HT_1$ to $HT_5$, is invariant.

Figure 18:
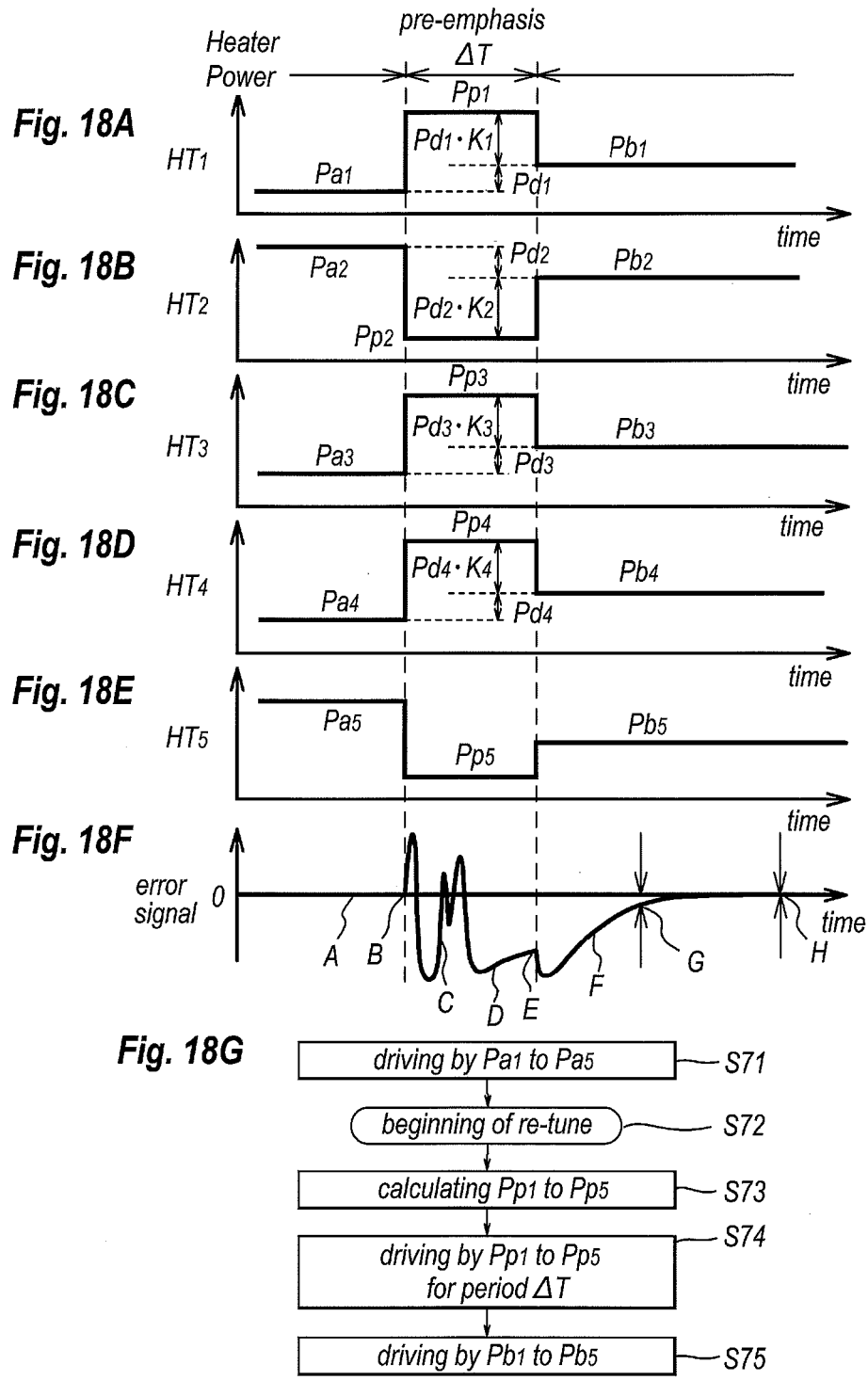
FIGS. 18A to 18E are time behaviors of the power supplied to respective heaters, $HT_1$ to $HT_5$.
FIG. 18F shows a behavior of the error signal and FIG. 18G is a flow chart of the algorithm to re-tune the emission wavelength.

FIGS. 18A to 18G show mechanisms to control the heaters, $HT_1$ to $HT_5$, where FIGS. 18A to 18E are time behaviors of the power supplied to respective heaters, $HT_1$ to $HT_5$, FIG. 18F shows the error signal corresponding to a difference between the target wavelength and a current wavelength, namely, the error signal shown in FIG. 2, and FIG. 18G is a flow chart of the algorithm to re-tune the emission wavelength according to the present embodiment.

At the time A before the beginning of the re-tune, the emission wavelength is kept in stable by the feedback control loop within one of plateaus, and the error signal is set to be substantially zero. The controller 30 supplies the power, $Pa_1$ to $Pa_5$, to respective heaters, $HT_1$ to $HT_5$, at step S71. Next, at the time B, the controller 30 begins the procedure to re-tune the emission wavelength (step S72). In an example shown in FIGS. 18A to 18E, the power supplied to the heaters, $HT_1$, $HT_3$ and $HT_4$, increase, while, the power for the heater $HT_2$ decrease. Setting the power corresponding to the new, re-tuned, emission wavelength to be $Pb_1$ to $Pb_4$, the pre-emphasis power, $Pp_1$ to $Pp_4$, supplied during the period $\Delta T$, may be calculated by the equation (3) above described using these power, $Pa_1$ to $Pa_4$, and $Pb_1$ to $Pb_4$ (step S73). Also, the controller 30 determines the last power, $Pa_5$, $Pb_5$, and $Pp_5$, by equations, (4) to (6), below indicated. That is, the power, $Pa_5$, $Pb_5$, and $Pp_5$, are determined such that a total power $P_{TOTAL}$, which is a sum of power supplied to respective heaters, $HT_1$ to $HT_5$, becomes invariant between before, after, and during the pre-emphasis:

$$Pa_1+Pa_2+Pa_3+Pa_4+Pa_5=P_{Total}, \quad (4)$$

$$Pb_1+Pb_2+Pb_3+Pb_4+Pb_5=P_{Total}, \quad (5)$$

$$Pp_1+Pp_2+Pp_3+Pp_4+Pp_5=P_{Total}. \quad (6)$$

Next, at step S73, the controller 30 supplies the pre-emphasis power determined in step S73 to respective heaters, $HT_1$ to $HT_5$, for the period of $\Delta T$. Finally, at step S75 in the end of the period $\Delta T$, the power is switched to values, $Pb_1$ to $Pb_5$, corresponding to the re-tuned wavelength. Thus, according to the present embodiment, the thermal conditions on the temperature controller (TEC) 20 may be maintained before and after the re-tune of the emission wavelength, which effectively suppresses the wavelength shift caused by the fluctuation of the thermal conditions on the temperature controller (TEC) 20.

First Modification of Second Embodiment

One method modified from the second embodiment shown in FIGS. 18A to 18G is to switch the control mode to the feedback control after passing a period $\Delta T'$ which begins at the end of the pre-emphasis period. FIGS. 19A to 19F show time behaviors of the heater power to be supplied to respective heaters, the behavior of the error signal, and FIG. 19G shows the flow chart of the control.

Figure 19:
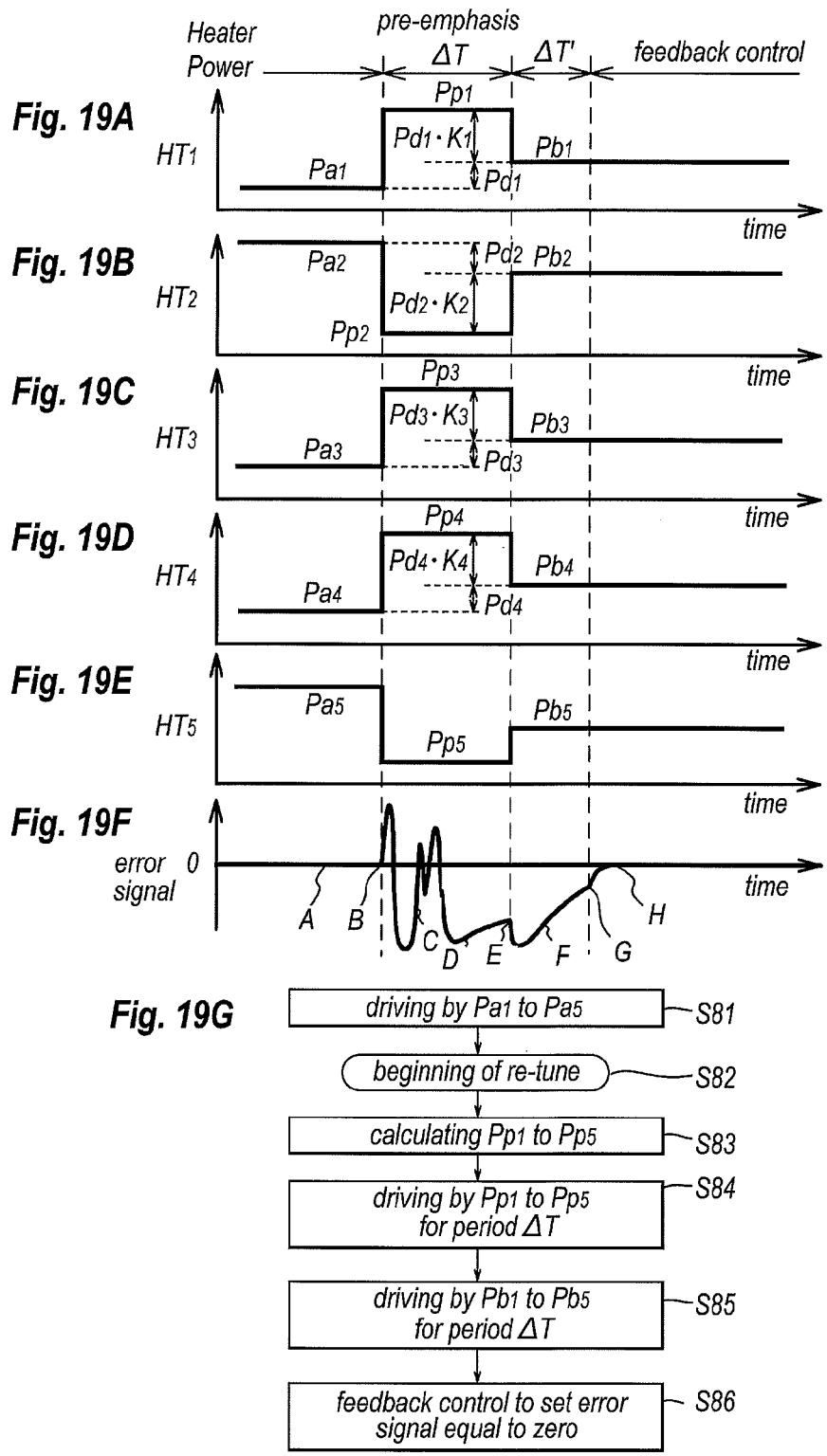
FIGS. 19A to 19E show time behaviors of the heater power to be supplied to respective heaters, the behavior of the error signal in FIG. 19F, and the flow chart of the control in FIG. 19G.

As shown in FIG. 19G, the method of the present modification provides steps S81 to S84 which are same with those of the steps, S71 to S74, according to the second embodiment. The controller 30 completes the pre-emphasis at the time E and supplies the preset power, $Pb_1$ to $Pb_5$, to respective heaters, $HT_1$ to $HT_5$, at step S85. Continuing the power to respective heaters, $HT_1$ to $HT_5$, in values, $Pb_1$ to $Pb_5$, for a period of $\Delta T'$; the controller 30 begins the feedback control at step S86 so as to set the error signal close to zero; namely, the emission wavelength becomes the target re-tuned wavelength.

Second Modification of Second Embodiment

Figure 20:
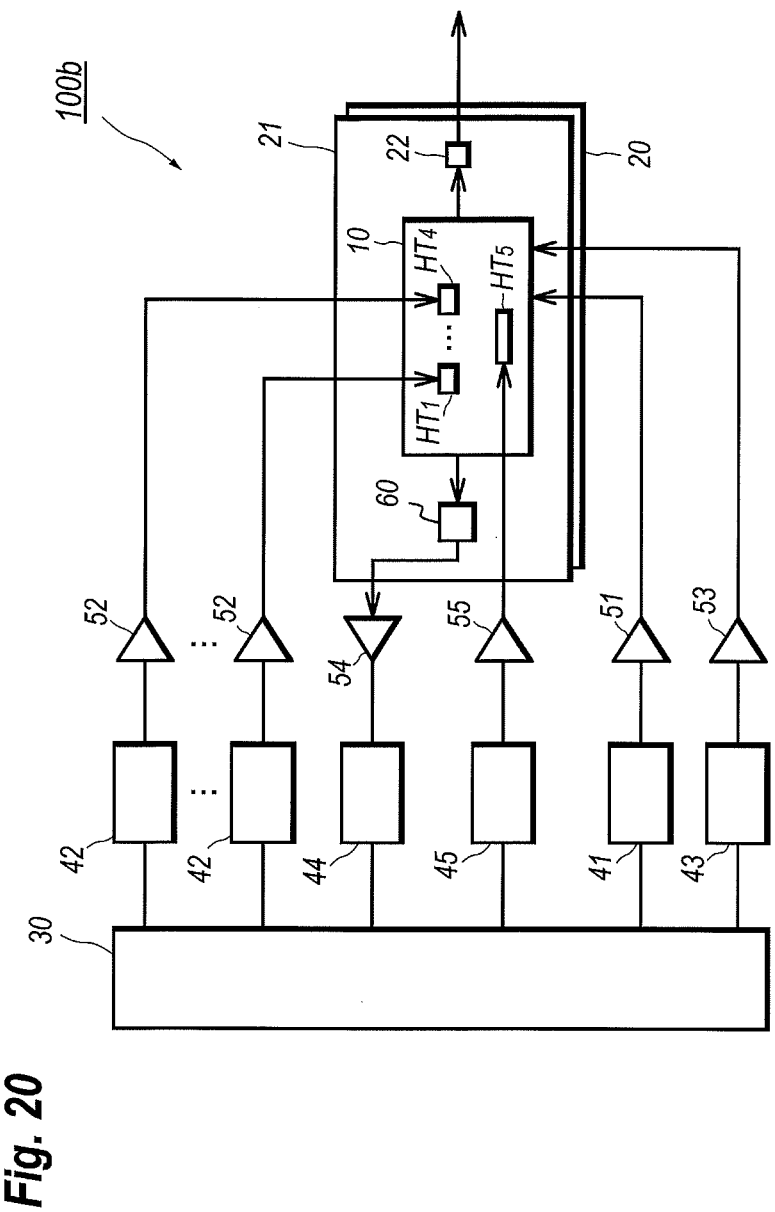
FIG. 20 shows a still another laser apparatus where the supplemental heater $HT_5$ is provided within the t-LD, or integrated within the t-LD.

In the arrangement of the second embodiment shown in FIG. 17, the additional heater $HT_5$ is provided on the temperature controller (TEC) 20 physically independent of the t-LD 10. However, the second embodiment is not restricted to this arrangement. For instance, a laser apparatus 100b shown in FIG. 20 provides the additional heater $HT_5$ on the t-LD 10, or integrated within the t-LD 10. In this arrangement, the power dissipation within the t-LD 10 may be substantially set constant before and after the re-tune of the emission wavelength. Accordingly, the thermal conditions on the temperature controller may be also stable and the emission wavelength, in particular, the fluctuation of the emission wavelength just after the beginning of the re-tuning may be suppressed.

The embodiments providing the additional heater $HT_5$ to set the sum of the heater power supplied to respective heaters, $HT_1$ to $HT_5$, in constant, but the method of the control of the heater power is not restricted to those procedures. That is, the control of the additional heater $HT_5$ may be performed to set at least a difference of the sum of the heater power, $HT_1$ to $HT_4$, between before the re-tune and the pre-emphasis, and between the pre-emphasis and after the re-tune becomes smaller than a difference of the sum of the heater power, $HT_1$ to $HT_5$. Specifically, the controller 30 may control the power supplied to the additional heater $HT_5$ such that $(Pp_1+ \ldots +Pp_5)-(Pa_1+ \ldots +Pa_5)<(Pp_1+ \ldots +Pp_4)-(Pa_1+ \ldots +Pa_4)$ and $(Pb_1+ \ldots +Pb_5)-(Pp_1+ \ldots +Pp_5)<(Pb_1+ \ldots +Pb_4)-(Pp_1+ \ldots +Pp_4)$. Then, the fluctuation of the emission wavelength around the beginning and the completion of the pre-emphasis may be effectively suppressed.

Other Arrangement of Tunable LD

The embodiments thus described concentrates on the t-LD 10 showing the function of the Vernier effect to determine the emission wavelength. Because the Vernier effect expands a range of the power supplied to the heaters, $HT_1$ to $HT_4$. However, the method according to the present application to accelerate the re-tune of the emission wavelength is not restricted to those LDs. FIG. 21A schematically illustrates a cross section of a tunable LD without the fourth heater $HT_4$ in the SG-DFB region. In the t-LD 10a shown in FIG. 21A, the heaters, $HT_1$ to $HT_3$, in the CSG-DBR region and the current injected into regions between the gain regions 13a may tune, or select the emission wavelength of the t-LD 10a. The procedures of the present embodiments may be effective for those t-LDs, 10 and 10a.

What is claimed is:

1. A laser apparatus, comprising
   a wavelength tunable laser diode (t-LD) providing a heater; and
   a controller to control power supplied to the heater to re-tune an emission wavelength of the t-LD by changing the power from first power Pa to second power Pb,
   wherein the controller supplies pre-emphasis power Pp before supplying the second power Pb, the pre-emphasis power Pp being greater than the second power Pb when the second power Pb is greater than the first power Pa, and supplies the pre-emphasis power Pp smaller than the second power Pb when the second power Pb is smaller than the first power Pa.

2. The laser apparatus of claim 1,
   wherein the power Pp is determined by an equation of:

$$Pp=Pb+K\cdot(Pb-Pa),$$

where K is a coefficient.

3. The laser apparatus of claim 2,
   wherein the t-LD provides n (>1) counts of heaters each supplied with first power Pai, second power Pbi, and pre-emphasis power Ppi specific to respective heaters, wherein respective pre-emphasis power Ppi are determined by equations of:

$Ppi = Pbi + Ki \times (Pbi - Pai) \quad i=1 \text{ to } n,$ wherein Ki is specific to the i-th heater.

4. The laser apparatus of claim 2,
wherein the coefficient K depends on a difference between the first power Pa and the second power Pb.

5. The laser apparatus of claim 2,
wherein the coefficient K depends on a polarity of a difference between the first power Pa and the second power Pb.

6. The laser apparatus of claim 2,
wherein the controller supplies an upper limit instead of the pre-emphasis power Pp when the pre-emphasis power Pp is greater than the upper limit, and supplies a lower limit instead of the pre-emphasis power Pp when the pre-emphasis power Pp is less than the lower limit.

7. The laser apparatus of claim 1,
wherein the controller suspends the supplement of the pre-emphasis power Pp when a difference between the first power Pa and the second power Pb is smaller than a threshold.

8. The laser apparatus of claim 1,
further comprising a wavelength detector to determine a current wavelength emitted from the t-LD,
wherein the controller controls the power supplied to the heater by a feedback loop including the wavelength detector from a preset period after setting the second power Pb to the heater.

9. The laser apparatus of claim 1,
further comprising a temperature controller to control a temperature of the t-LD, and an additional heater,
wherein the controller controls power supplied to the additional heater such that a sum of the pre-emphasis power Pp and power supplied to the additional heater during the pre-emphasis subtracted by a sum of the first power Pa and power supplied to the additional heater before the pre-emphasis becomes less than the pre-emphasis power Pp subtracted with the first power Pa; and a sum of the second power Pb and power supplied to the additional heater after the pre-emphasis subtracted by the sum of the pre-emphasis power Pp and the power supplied to the additional heater during the pre-emphasis becomes less than the second power Pb subtracted by the pre-emphasis power Pp.

10. The laser apparatus of claim 1,
wherein the t-LD includes n counts of heaters each supplied with first power Pai (i=1 to n) specific to respective heaters before the pre-emphasis, pre-emphasis power Ppi (i=1 to n) specific to respective haters during the pre-emphasis, and second power Pbi (i=1 to n) specific to respective heaters after the pre-emphasis, and an additional heater,
wherein the controller controls the power supplied to the additional heater such that a sum of the pre-emphasis power Ppi and the power supplied to the additional heater during the pre-emphasis subtracted with a sum of the first power Pai and the power supplied to the additional heater before the pre-emphasis becomes smaller than a sum of the pre-emphasis power Ppi subtracted with the sum of the first power Pai; and a sum of the second power Pbi and power supplied to the additional heater after the pre-emphasis subtracted with the sum of the pre-emphasis power Ppi and the power supplied to the additional heater during the pre-emphasis becomes smaller than the second power Pbi subtracted with the sum of the pre-emphasis power Ppi.

11. The laser apparatus of claims 9,
wherein the additional heater is mounted on the temperature controller.

12. The laser apparatus of claims 9,
wherein the additional heater is integrated with the t-LD.

13. The laser apparatus of claim 10,
wherein the t-LD includes a chirped sampled grating distributed Bragg reflector (CSG-DBR) region providing at least of heaters and a sampled grating distributed feedback (SG-DFB) region providing at least another one of heaters.

14. A method to re-tune an emission wavelength of a wavelength tunable LD (t-LD) that integrates a heater to modify a temperature of the t-LD, the t-LD emitting light with a first wavelength stably by being provided with first power Pa, the method comprising steps of:
triggering by a command to re-tune the emission wavelength, providing pre-emphasis power Pp for a preset period to the heater; and
supplying second power Pb to the heater,
wherein the pre-emphasis power Pp is greater than the second power Pb when the second power Pb is greater than the first Pa but smaller than the second power Pb when the second power Pb is smaller than the first power Pa.

15. The method of claim 14,
wherein the t-LD further provides an additional heater,
wherein the step of providing the pre-emphasis power Pp includes a step of providing power to the additional heater such that a sum of the first power Pa and power supplied to the additional heater before triggering becomes equal to a sum of the pre-emphasis power Pp and power supplied to the additional heater during the pre-emphasis, and
wherein the step of providing the second power Pb includes a step of providing power to the additional heater such that a sum of the pre-emphasis power Pp and the power supplied to the additional heater during the pre-emphasis becomes equal to a sum of the second power Pb and power supplied to the additional heater after the pre-emphasis.

16. The method of claim 14,
wherein the t-LD further provides an additional heater,
wherein the step of providing the pre-emphasis power Pp includes a step of providing power to the additional heater such that a sum of the pre-emphasis power Pp and power supplied to the additional heater during the pre-emphasis subtracted with a sum of the first power Pa and power supplied to the additional heater before the pre-emphasis becomes less than the pre-emphasis power Pp subtracted with the first power Pa, and
wherein the step of providing the second power Pb includes a step of providing the second power Pb such that a sum of the second power Pb and power supplied to the additional heater after the pre-emphasis subtracted with a sum of the pre-emphasis power Pp and the power supplied to the additional heater during the pre-emphasis becomes less than the second power Pb subtracted with the pre-emphasis power Pp.

* * * * *

UNITED STATES PATENT AND TRADEMARK OFFICE
CERTIFICATE OF CORRECTION

PATENT NO. : 9,444,221 B2
APPLICATION NO. : 14/790667
DATED : September 13, 2016
INVENTOR(S) : Uesaka et al.

Page 1 of 1

It is certified that error appears in the above-identified patent and that said Letters Patent is hereby corrected as shown below:

On the Title Page:
In the Title, replace "LASER APPARATUS AND METHOD TO RE-TUNE EMISSION WAVELENGTH TUNABLE LD" with --LASER APPARATUS AND METHOD TO RE-TUNE EMISSION WAVELENGTH OF WAVELENGTH TUNABLE LD--.

In the Specification:
At column 1, lines 1-3, in the title, replace "LASER APPARATUS AND METHOD TO RE-TUNE EMISSION WAVELENGTH TUNABLE LD" with --LASER APPARATUS AND METHOD TO RE-TUNE EMISSION WAVELENGTH OF WAVELENGTH TUNABLE LD--.

In the Claims:
Claim 11, column 16, line 5, replace "The laser apparatus of claims 9" with --The laser apparatus of claim 9--;

Claim 12, column 16, line 8, replace "The laser apparatus of claims 9" with --The laser apparatus of claim 9--.

Signed and Sealed this
Twentieth Day of December, 2016

Michelle K. Lee
*Director of the United States Patent and Trademark Office*